United States Patent
Fujimoto et al.

(10) Patent No.: US 7,943,407 B2
(45) Date of Patent: May 17, 2011

(54) METHOD FOR MANUFACTURING SEMICONDUCTOR LASER

(75) Inventors: Tsuyoshi Fujimoto, Kanagawa (JP); Nozomi Ohashi, Ohashi (JP); Masaru Kuramoto, Kanagawa (JP); Eiji Nakayama, Miyagi (JP)

(73) Assignee: Sony Corporation, Tokyo (JP)

( * ) Notice: Subject to any disclaimer, the term of this patent is extended or adjusted under 35 U.S.C. 154(b) by 5 days.

(21) Appl. No.: 12/591,286

(22) Filed: Nov. 16, 2009

(65) Prior Publication Data
US 2010/0151611 A1 Jun. 17, 2010

(30) Foreign Application Priority Data
Dec. 15, 2008 (JP) ................................. 2008-318052

(51) Int. Cl.
*H01L 21/00* (2006.01)
(52) U.S. Cl. ................ 438/39; 438/29; 438/31; 438/32; 438/40; 438/45; 257/E21.097
(58) Field of Classification Search .......................... None
See application file for complete search history.

(56) References Cited

U.S. PATENT DOCUMENTS
5,523,256 A * 6/1996 Adachi et al. .................... 438/31
5,763,291 A * 6/1998 Motoda et al. .................. 438/39

FOREIGN PATENT DOCUMENTS
| JP | 61-216374 A | 9/1986 |
| JP | 09-018085 A | 1/1997 |
| JP | 2005-216990 | 8/2005 |
| JP | 2005-347630 A | 12/2005 |
| JP | 2008-235790 A | 10/2008 |
| JP | 2008-277492 A | 11/2008 |

OTHER PUBLICATIONS
Japanese Office Action issued Oct. 19, 2010 for corresponding Japanese Application No. 2008-318052.

* cited by examiner

*Primary Examiner* — N Drew Richards
*Assistant Examiner* — Kyoung Lee
(74) *Attorney, Agent, or Firm* — Rader, Fishman & Grauer PLLC

(57) ABSTRACT

A method for manufacturing a semiconductor laser includes the steps of forming a mask layer having a stripe-shaped mask portion corresponding to a ridge stripe to be formed on a nitride-based group III-V compound semiconductor layer, etching the nitride-based group III-V compound semiconductor layer to a predetermined depth using the mask layer to form the ridge stripe, forming a resist to cover the mask layer and the nitride-based group III-V compound semiconductor layer, etching-back the resist until the stripe-shaped mask portion of the mask layer is exposed, removing the exposed mask portion of the mask layer by etching to expose the upper surface of the ridge stripe, forming a metal film on the resist and the exposed ridge stripe to form an electrode on the ridge stripe, removing the resist together with the metal film formed thereon, and removing the mask layer by etching.

8 Claims, 23 Drawing Sheets

$\theta = 87.8°$

METHOD FOR MANUFACTURING SEMICONDUCTOR LASER

BACKGROUND OF THE INVENTION

1. Field of the Invention

The present invention relates to a method for manufacturing a semiconductor laser and particularly to a method preferably applied to manufacture of a ridge-stripe semiconductor laser having a current non-injection structure near an end face.

2. Description of the Related Art

There have been proposed nitride-based semiconductor lasers in which portions near both end faces of a resonator serve as current non-injection regions in order to suppress end face deterioration due to COD (Catastrophic Optical Damage) with increases in output (refer to, for example, Japanese Unexamined Patent Application Publication No. 2005-216990). The semiconductor lasers are shown in FIGS. 28 to 30.

In the semiconductor laser shown in FIG. 28, a ridge-shaped laser stripe, i.e., a ridge stripe 103, serving as a light-emitting portion is formed on a nitride semiconductor grown layer 102 grown on an n-type GaN substrate 101. The top of the ridge stripe 103 includes a p-type GaN contact layer 102a.

The ridge stripe 103 is formed as follows. A tripe-shaped resist (not shown) corresponding to the ridge stripe 103 to be formed is formed on the nitride semiconductor grown layer 102. Next, the nitride semiconductor grown layer 102 is etched by dry etching using the resist as a mask to form the ridge stripe 103.

Next, a $SiO_2$ buried layer 104 for a current-confining layer is formed over the entire surface, and then a portion of the $SiO_2$ buried layer 104, which is disposed on the ridge stripe 103, is removed by etching. Next, a p-side electrode 105 is formed on the p-type GaN contact layer 102a at the top of the ridge stripe 103 so as to avoid regions near the end faces. Therefore, a region where the p-side electrode 105 is not formed is provided as a current non-injection region 106 near an end face of the ridge stripe 103.

In the semiconductor laser shown in FIG. 29, a $SiO_2$ insulating layer 7 is inserted between a nitride semiconductor grown layer 102 and a p-side electrode 105 within a region near an end face of a ridge stripe 103. the nitride semiconductor grown layer 102 and the p-side electrode 105 are electrically insulated with the $SiO_2$ insulating layer 107 to provide a current non-injection region 106 near an end face of the ridge stripe 103.

In a semiconductor laser shown in FIG. 30, boron (B) ions are implanted into a region of a p-type GaN contact layer 102a near an end face of a ridge stripe 103 to form a high-resistance region serving as a current non-injection region 106. Alternatively, dry etching damage is produced in a region of a p-type GaN contact layer 102a near an end face of a ridge stripe 103. Then, a p-side electrode 105 is put into Schottky contact with the region of the p-type GaN contact layer 102a where dry etching damage is produced, thereby forming a current non-injection region 106 near the end face of the ridge stripe 103.

SUMMARY OF THE INVENTION

However, in the semiconductor laser shown in FIG. 28, the ridge stripe 103 is formed by etching the nitride semiconductor grown layer 102 using as the mask the organic resist. Therefore, there is the following problem. Since the surface of the nitride semiconductor grown layer 102 is easily contaminated with the organic resist, the surface state of the p-type GaN contact layer 102a at the top of the ridge stripe 103, which is the contact interface with the p-side electrode 105, becomes unstable. Therefore, the contact resistance of the p-side electrode 105 is increased, thereby increasing the operating voltage of the semiconductor laser.

In addition, it is very difficult to expose the surface of the p-type GaN contact layer 102a by etching the $SiO_2$ buried layer 104 to achieve ohmic contact with the p-side electrode 105 without damaging the surface of the p-type GaN contact layer 102a. Further, Pd/Mo/Au is used as the p-side electrode 105, but a Pd film in the bottom layer of the p-side electrode 105 has low adhesion to the current-confining $SiO_2$ buried layer 104, thereby causing the problem of separation of the p-side electrode 105 at the interface therebetween.

In the semiconductor laser shown in FIG. 29, like in the semiconductor laser shown in FIG. 28, it is very difficult to expose the surface of the p-type GaN contact layer 102a at the top of the ridge stripe 103 within the current injection region. Further, a Pd film in the bottom layer of the p-side electrode 105 has low adhesion to the current-confining $SiO_2$ buried layer 104, thereby causing the problem of separation of the p-side electrode 105 at the interface therebetween.

In the semiconductor laser shown in FIG. 30, like in the semiconductor laser shown in FIG. 28, a Pd film in the bottom layer of the p-side electrode 105 has low adhesion to the current-confining $SiO_2$ buried layer 104, thereby causing the problem of separation of the p-side electrode 105 at the interface therebetween.

As described above, the method for forming a current non-injection structure near the end face in a nitrogen-based semiconductor laser has many problems to be solved.

Accordingly, it is desirable to provide a method for manufacturing a semiconductor laser using a nitride-based group III-V compound semiconductor, the method being capable of easily forming a current non-injection region near an end face and achieving good ohmic contact between a ridge stripe and an electrode with low contact resistance.

Also, it is desirable to provide a method for manufacturing a semiconductor laser using a nitride-based group III-V compound semiconductor, the method being capable of easily forming a current non-injection region near an end face and improving adhesion between a current-confining insulating film and an electrode.

According to an embodiment of the present invention, a method for manufacturing a semiconductor laser includes the steps of forming a mask layer having a stripe-shaped mask portion with a shape corresponding to a ridge stripe to be formed on a nitride-based group III-V compound semiconductor layer in which a laser structure is formed, etching the nitride-based group III-V compound semiconductor layer to a predetermined depth using the mask layer to form the ridge stripe, forming a resist to cover the mask layer and the nitride-based group III-V compound semiconductor layer so that the thickness of the resist is minimized on a portion of the stripe-shaped mask portion of the mask layer, which corresponds to a current injection region of the ridge stripe, etching-back the resist until the stripe-shaped mask portion of the mask layer is exposed, removing the exposed stripe-shaped mask portion of the mask layer by etching to expose the upper surface of the ridge stripe, forming a metal film for forming an electrode on the resist and the exposed ridge stripe to form an electrode on the ridge stripe, removing the resist together with the metal film formed thereon, and removing the mask layer by etching after removing the resist.

In a semiconductor laser manufactured by the above-described method for manufacturing a semiconductor laser, a} portion of a ridge stripe, which is disposed between a resonator end face forming position and the electrode, serves as the current non-injection region.

The resist having the minimum thickness on a portion of the stripe-shaped mask portion of the mask layer, which corresponds to the current injection region of the ridge stripe, may be formed by various methods. In a typical example, first a first resist is formed to cover the mask layer and the nitride-based group III-V compound semiconductor layer. Next, an opening including the current injection region of the ridge stripe and having a width equal to the length of the current injection region in the extension direction of the ridge stripe is formed in the first resist. Then, a second resist is formed on the first resist and the opening.

Typically, after the mask layer is removed by etching, a current-confining insulating film is formed over the entire surface, specifically, formed to extend on the electrode, the upper surface of a portion of the ridge stripe on which the electrode is not formed, both side surfaces of the ridge stripe, and the bottoms on both sides of the ridge stripe. Typically, the method for manufacturing a semiconductor laser further includes a step of etching off a portion of the current-confining insulating film, which is disposed on the electrode, to expose the electrode after forming the current-confining insulating film. Typically, the method for manufacturing a semiconductor laser further includes a step of forming a pad electrode extending on the electrode and the current-confining insulating film after exposing the electrode. The pad electrode is integrated with the electrode formed on the ridge stripe to form an electrode as a whole.

From the viewpoint of improving the properties of ohmic contact between the ridge stripe and the electrode, the bottom layer of the electrode is preferably composed of Pd or Ni. From the viewpoint of improving the adhesion to the current-confining insulating film, the bottom layer of the electrode is preferably composed of Ti.

Typically, the top portion of the ridge stripe includes a p-type contact layer, and the electrode is a p-side electrode in contact with the p-type contact layer.

The nitride-based group III-V compound semiconductor is most generally composed of $Al_xB_yGa_{1-x-y-z}In_zAs_uN_{1-u-v}P_v$ (wherein $0 \leq x \leq 1, 0 \leq y \leq 1, 0 \leq z \leq 1, 0 \leq u \leq 1, 0 \leq v \leq 1, 0 \leq x+y+z<1, 0 \leq u+v<1$). More specifically, the nitride-based group III-V compound semiconductor is composed of $Al_xB_yGa_{1-x-y-z}In_zN$ (wherein $0 \leq x \leq 1, 0 \leq y \leq 1, 0 \leq z \leq 1, 0 \leq x+y+z<1$), and typically composed of $Al_xGa_{1-x-z}In_zN$ (wherein $0 \leq x \leq 1, 0 \leq z \leq 1$). Examples of the nitride-based group III-V compound semiconductor include, but are not limited to, GaN, InN, AlN, AlGaN, InGaN, AlGaInN, and the like.

The nitride-based group III-V compound semiconductor is grown by, for example, metal-organic chemical vapor deposition (MOCVD) or epitaxial growth method such as hydride vapor phase epitaxy or halide vapor phase epitaxy (HVPE), molecular beam epitaxy (MBE), or the like. As the substrate, a conductive semiconductor substrate, preferably a nitride-based group III-V compound semiconductor substrate (most typically, a GaN substrate) may be used. The substrate may be an insulating substrate such as a sapphire substrate and may further include at least one nitride-based group III-V compound semiconductor layer grown on the substrate.

In the present invention configured as described above, the upper surface of the current injection region of the ridge stripe is not contaminated with an organic material during the process for manufacturing a semiconductor laser, thereby maintaining the upper surface of the current injection region of the ridge stripe in a stable state. Therefore, the electrode may be formed with high positional precision on the stable upper surface of the current injection region of the ridge stripe. In addition, when the bottom layer of the electrode is composed of Pd or Ni, and the bottom layer of the pad electrode is composed of Ti, the properties of ohmic contact between the ridge stripe and the electrode and the adhesion to the current-confining insulating film may be improved.

According to an embodiment of the present invention, it may be possible to easily manufacture a semiconductor laser using a nitride-based group III-V compound semiconductor and having a current non-injection structure near an end face, in which an electrode is in good ohmic contact with an upper surface of a ridge stripe with low contact resistance. Also is may be possible to improve the ohmic contact properties of an electrode with a ridge stripe and adhesion to a current-confining insulating film.

DESCRIPTION OF THE PREFERRED EMBODIMENTS

The best mode (referred to as an "embodiment" hereinafter) for carrying out the present invention is described. Description is made in the following order.

1. First embodiment (method for manufacturing semiconductor laser)
2. Second embodiment (method for manufacturing semiconductor laser)
3. Third embodiment (method for manufacturing semiconductor laser)

First Embodiment

Method for Manufacturing Semiconductor Laser

A method for manufacturing a GaN-based semiconductor laser according to a first embodiment is described. The GaN-based semiconductor laser has a ridge stripe structure and includes current non-injection regions near both end faces of a resonator.

Figure 1:
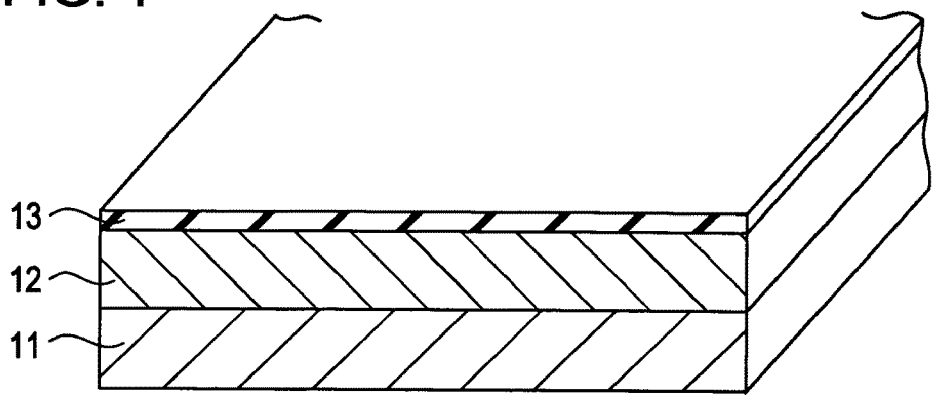
FIG. 1 is a perspective view illustrating a method for manufacturing a GaN-based semiconductor laser according to a first embodiment of the present invention.

In the first embodiment, first, as shown in FIG. 1, a GaN-based semiconductor layer 12 in which a laser structure is formed on an n-type GaN substrate 11 by epitaxial growth. The epitaxial growth of the GaN-based semiconductor layer 12 may be performed by, for example, a metal-organic chemical vapor deposition (MOCVD) method, but the method is not limited to this. The top layer of the GaN-based semiconductor layer 12 includes a p-type GaN contact layer.

In an example of a GaN-based semiconductor laser having a SCH (Separate Confinement Heterostructure) structure, for example, the GaN-based semiconductor layer 12 includes an n-type AlGaN cladding layer, an n-type GaN light guide layer, an undoped $Ga_{1-x}In_xN$ (quantum well layer)/$Ga_{1-y}In_yN$ (barrier layer, x>y) multiquantum well structure active layer, an undoped InGaN light guide layer, an undoped AlGaN light guide layer, a p-type AlGaN electron barrier layer, a p-type GaN/undoped AlGaN superlattice cladding layer, and a p-type GaN contact layer which are provided in order from below.

In this case, the growth temperature of the layers not containing In, i.e., the n-type AlGaN cladding layer, the n-type GaN light guide layer, the undoped AlGaN light guide layer, the p-type AlGaN electron barrier layer, a p-type GaN/undoped AlGaN superlattice cladding layer, and the p-type GaN contact layer, is, for example, 900° C. to 1100° C. In addition, the growth temperature of the layers containing In, i.e., the undoped $Ga_{1-x}In_xN/Ga_{1-y}In_yN$ multiquantum well structure active layer and the undoped InGaN light guide layer is, for example, 700° C. to 800° C., but is not limited to this.

Materials used for growing the GaN-based semiconductor layers are as follows. Examples of a material for Ga include triethylgallium $((C_2H_5)_3Ga$, TEG) and trimethylgallium $((CH_3)_3Ga$, TMG). Examples of a material for Al include trimethylaluminum $((CH_3)_3Al$, TMA). Examples of a material for In include triethylindium $((C_2H_5)_3In$, TEI) and trimethylindium $((CH_3)_3In$, TMI). Examples of a material for N include ammonia ($NH_3$). With respect to a dopant, examples of a n-type dopant include silane ($SiH_4$). Examples of a p-type dopant include bis(methylcyclopentadienyl)magnesium $((CH_3C_5H_4)_2Mg)$, bis(ethylcyclopentadienyl)magnesium $((C_2H_5C_5H_4)_2Mg)$, and bis(cyclopentadienyl)magnesium $((C_5H_5)_2Mg)$.

Next, an insulating film 13 is formed over the entire surface of the GaN-based semiconductor layer 12. As the insulating film 13, any one of various films may be used as long as it is used as a mask during dry etching for forming a ridge stripe described below. For example, a $SiO_2$ film, a SiN film, and the like may be used, but the insulating film 13 is not limited to these. The thickness of the insulating film 13 is selected according to demand, but is, for example, about 500 nm. The insulating film 13 may be formed by, for example, vacuum evaporation, CVD, or the like, but the method is not limited to these. Before the insulating film 13 is formed, the surface of the GaN-based semiconductor layer 12 is cleaned by pre-treatment with a HF-type treatment solution according to demand.

Next, in order to electrically activate p-type impurities doped in the p-type layers which constitute the GaN-based semiconductor layer 12, heat treatment is performed at a temperature of 700° C. to 800° C. in an atmosphere not containing hydrogen, e.g., a nitrogen atmosphere. According to demand, the surface of the insulating film 13 is treated with acetone before activation.

Next, the insulating film 13 is coated with a resist (not shown), and then the resist is exposed to light using a photomask having a mask pattern with a predetermined shape formed therein. Next, the selectively exposed resist is developed to form a mask portion having a stripe shape corresponding to the shape of a ridge stripe to be formed later and groove-like openings extending in parallel to the mask portion on both sides of the mask portion. A large number of the mask portion and the openings are periodically formed in parallel at a predetermined pitch.

Figure 2:
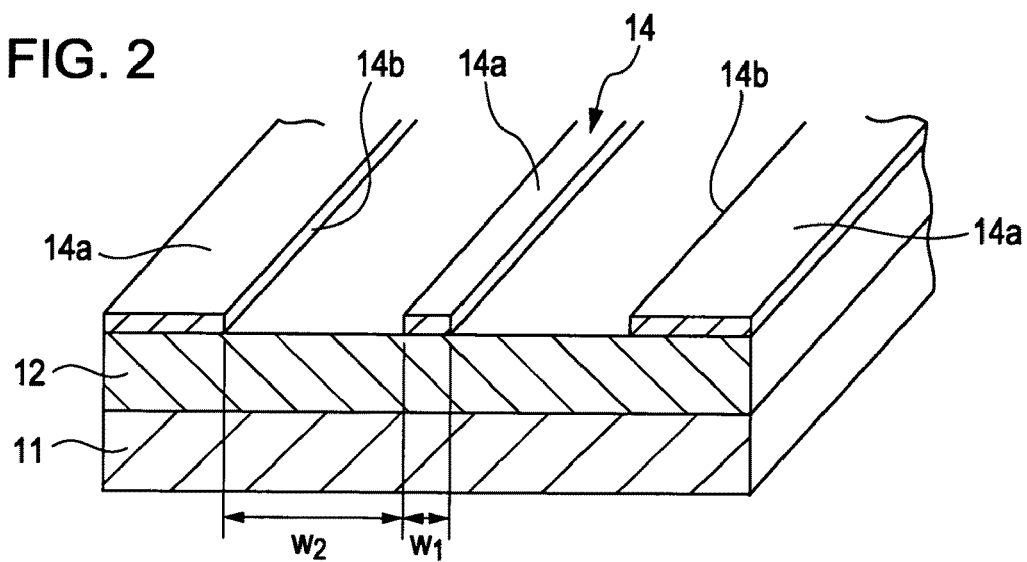
FIG. 2 is a perspective view illustrating the method for manufacturing a GaN-based semiconductor laser according to the first embodiment of the present invention.

Next, as shown in FIG. 2, the insulating film 13 is etched using as a mask the thus-formed resist to form a mask layer 14 including a mask portion 14a and groove-like openings 14b extending in parallel to the mask portion 14a on both sides of the mask portion 14a. The width $w_1$ of the stripe-shaped mask portion 14a is determined according to the width (e.g., 1.0 to 1.6 μm) of a ridge stripe to be formed, but is, for example, 1.3 μm. Also, the width $w_2$ of the openings 14b is determined according to demand, but is, for example, 20 μm. For example, when a $SiO_2$ film is used as the insulating film 13, the resist is wet-etched with a HF-based etchant, but etching is not limited to this. Then, the resist used in etching is removed.

Figure 3:
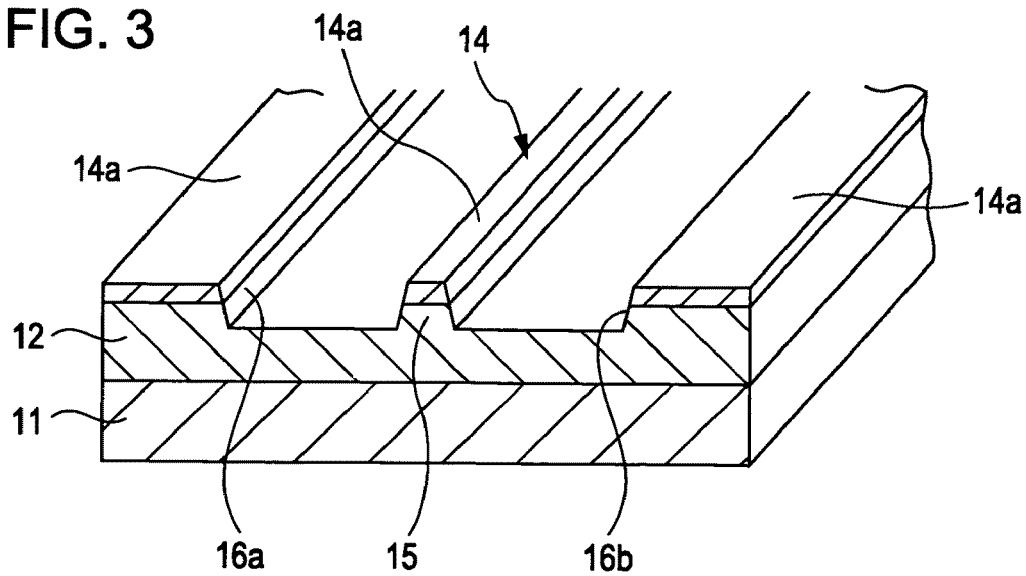
FIG. 3 is a perspective view illustrating the method for manufacturing a GaN-based semiconductor laser according to the first embodiment of the present invention.
Figure 4:
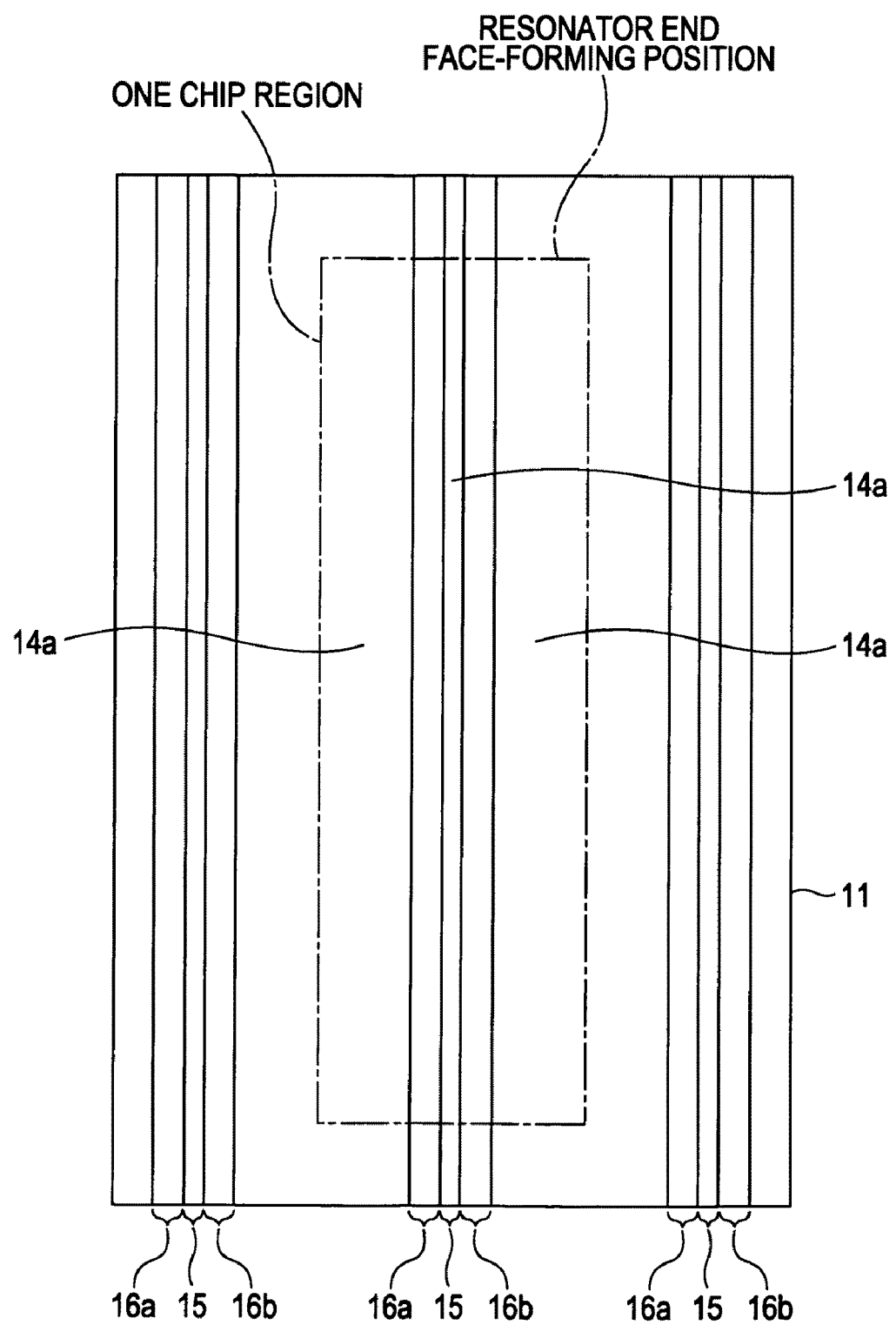
FIG. 4 is a plan view illustrating the method for manufacturing a GaN-based semiconductor laser according to the first embodiment of the present invention.

Next, as shown in FIG. 3, the GaN-based semiconductor layer 12 is dry-etched to a predetermined depth by a RIE method using the mask layer 14 and, for example, a chlorinated etching gas to form a ridge stripe 15. The height of the ridge stripe 15 is determined according to demand and is, for example, 0.4 μm to 0.5 μm, but is not limited to this. For example, when the GaN-based semiconductor layer 12 has a configuration as in the above-described example, the ridge stripe 15 may be formed to the depth at an intermediate position of the p-type GaN/undoped AlGaN superlattice cladding layer. In addition, groove 16a and 16b are formed on both sides of the ridge stripe 15. FIG. 4 is a plan view showing this state within a wider region of the n-type GaN substrate 11. FIG. 4 shows an example of the shape and size of one chip region, but the shape and size is not limited to this.

Figure 5:
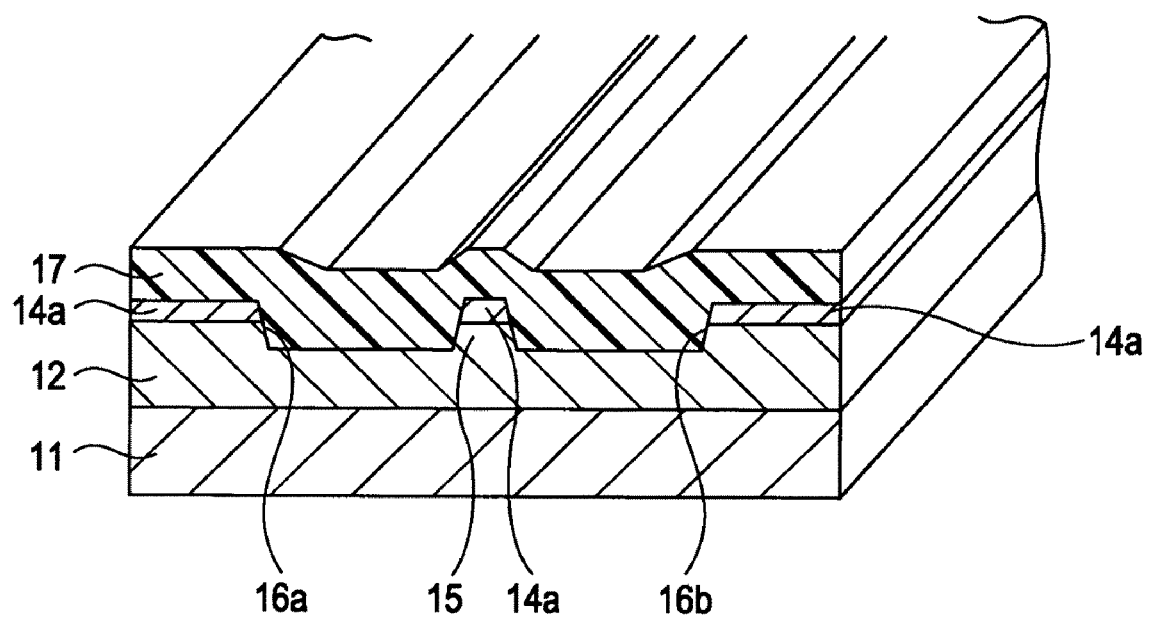
FIG. 5 is a perspective view illustrating the method for manufacturing a GaN-based semiconductor laser according to the first embodiment of the present invention.

Next, as shown in FIG. 5, the entire surface of the GaN-based semiconductor layer 12 having the ridge stripe 15 formed therein as described above is coated with a resist 17. As the resist 17, for example, a positive resist is used. The thickness of the resist 17 is determined according to demand and is, for example, about 1.3 μm. Since the upper surface of the ridge stripe 15 is covered with the insulating film 13 during coating of the resist 17, the upper surface is not contaminated with the resist 17 composed of an organic material.

Figure 6A:
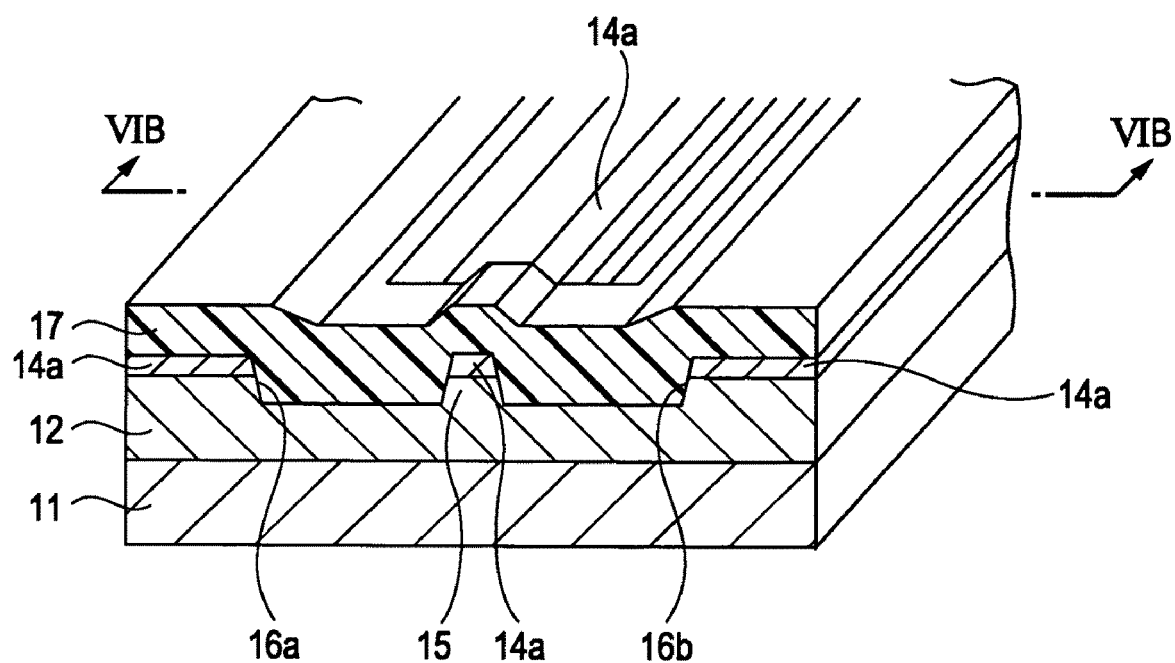
FIGS. 6A and 6B are a perspective view and a sectional view, respectively, illustrating the method for manufacturing a GaN-based semiconductor laser according to the first embodiment of the present invention.
Figure 6B:
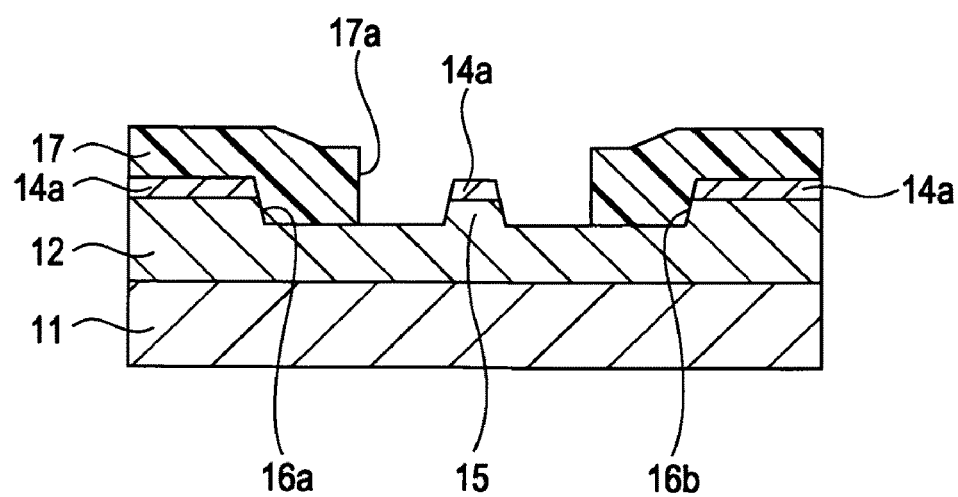

Next, as shown in FIG. 6A, the resist 17 is exposed to light using a photomask having a mask pattern with a predetermined shape formed therein and is further developed. As a result, the resist 17 having an opening 17a with a rectangular planar shape is formed, the opening 17a including a portion for a current injection region of the ridge stripe 15 and portions of the grooves 16a and 16b on both sides. The width of the opening 17a in the extension direction of the ridge stripe 15 equals to the length of the current injection region. FIG. 6B is a sectional view taken along line VIB-VIB in FIG. 6A. A portion of the ridge stripe 15 and portions of the grooves 16a and 16b are exposed in the opening 17a. Then, the surface of the resist 17 is irradiated with ultraviolet light to form a modified layer (not shown) and is cured.

Figure 7A:
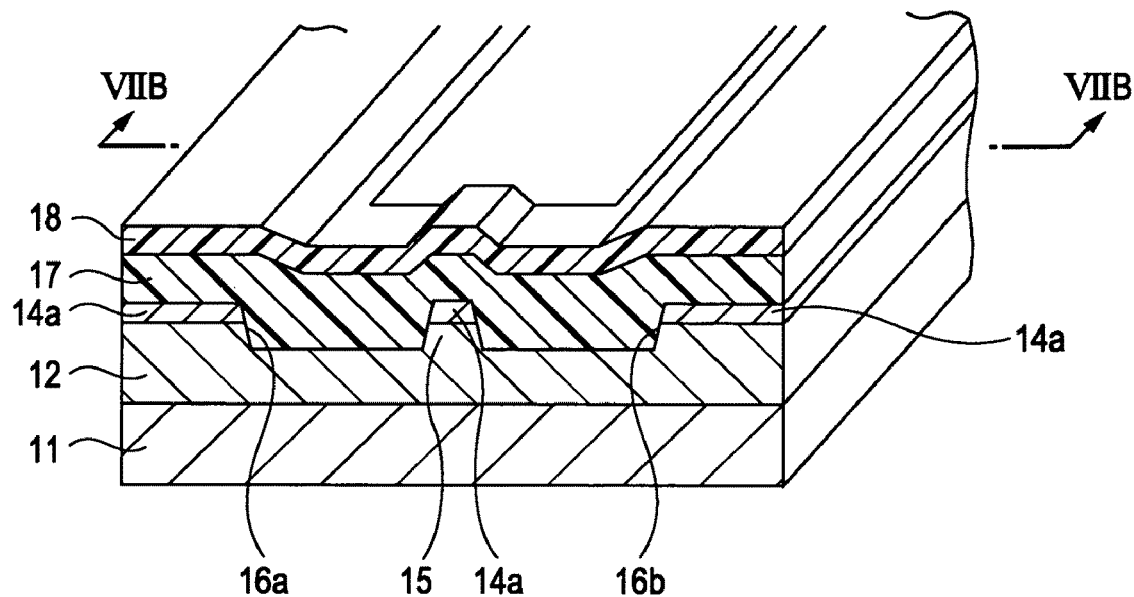
FIGS. 7A and 7B are a perspective view and a sectional view, respectively, illustrating the method for manufacturing a GaN-based semiconductor laser according to the first embodiment of the present invention.
Figure 7B:
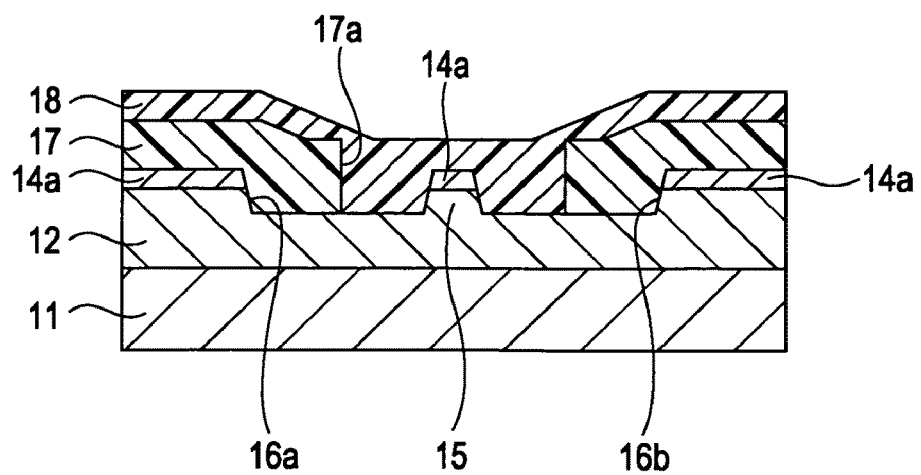

Next, as shown in FIG. 7A, the entire surface of the GaN-based semiconductor layer 12 having the resist 17 formed thereon as described above is coated with a resist 18, and then the resist 18 is solidified by baking. As the resist 18, for example, a positive resist is used. The thickness of the resist 18 is determined according to demand and is, for example, about 0.8 μm. The opening 17a of the resist 17 is filled with the resist 18. In this case, the thickness of the resist 18 on the ridge stripe 15 within the opening 17a is sufficiently smaller than the thickness of the resist 18 outside the ridge stripe 15 or the total thickness of the resists 17 and 18. FIG. 7B is a sectional view taken along line VIIB-VIIB in FIG. 7A.

Figure 8A:
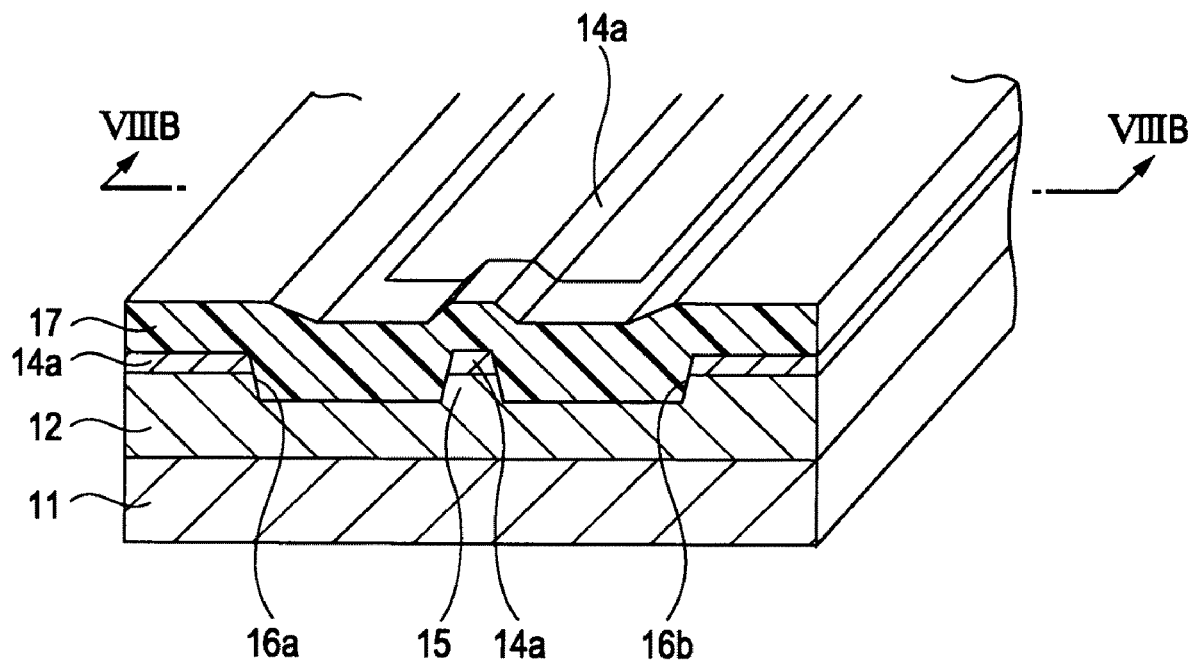
FIGS. 8A and 8B are a perspective view and a sectional view, respectively, illustrating the method for manufacturing a GaN-based semiconductor laser according to the first embodiment of the present invention.
Figure 8B:
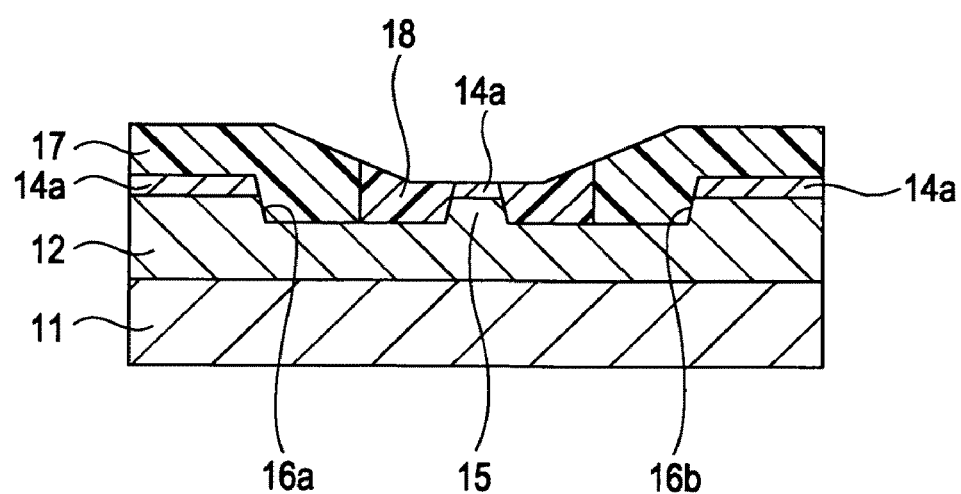

Next, as shown in FIG. 8A, the resists 17 and 18 are etched-back by a RIE method in a direction perpendicular to the surface of the n-type GaN substrate 11 to expose the mask portion 14a of the mask layer 14 on the ridge stripe 15. FIG. 8B is a sectional view taken along line VIIIB-VIIIB in FIG. 8A.

Figure 9A:
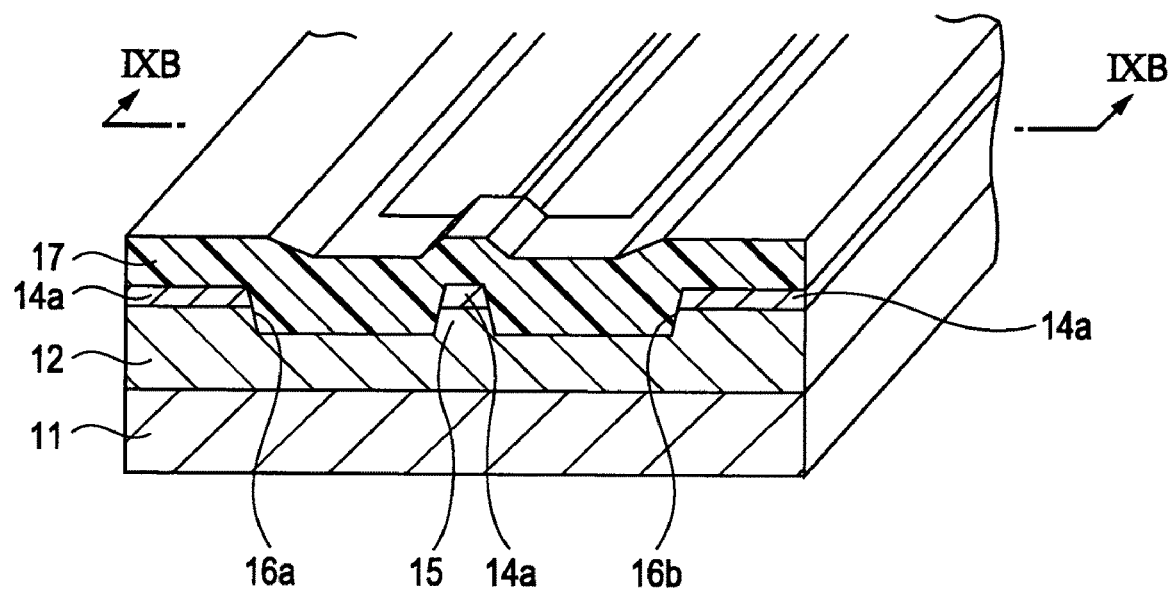
FIGS. 9A and 9B are a perspective view and a sectional view, respectively, illustrating the method for manufacturing a GaN-based semiconductor laser according to the first embodiment of the present invention.
Figure 9B:
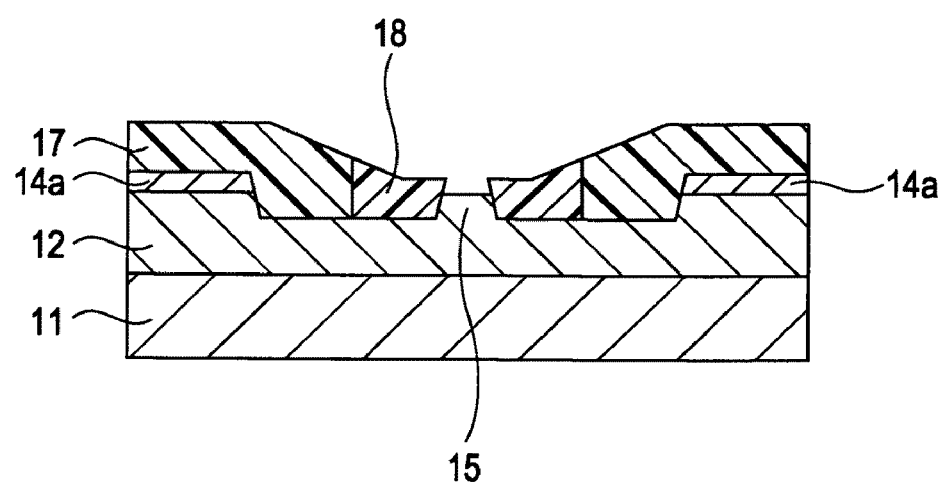

Next, as shown in FIG. 9A, the exposed mask portion 14a of the mask layer 14 is removed by etching to expose the upper surface of the ridge stripe 15 within the current injection region. For example, when the mask layer 14 includes a $SiO_2$ film, wet etching with a HF-type etchant is performed, but etching is not limited to this. FIG. 9B is a sectional view taken along line IXB-IXB in FIG. 9A.

Figure 10A:
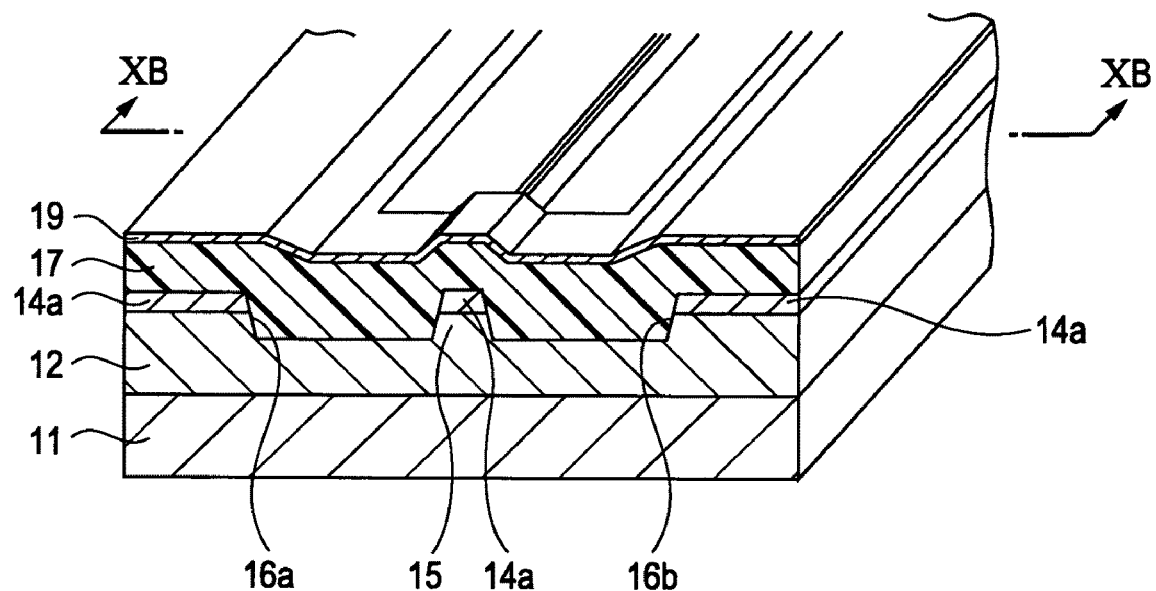
FIGS. 10A and 10B are a perspective view and a sectional view, respectively, illustrating the method for manufacturing a GaN-based semiconductor laser according to the first embodiment of the present invention.
Figure 10B:
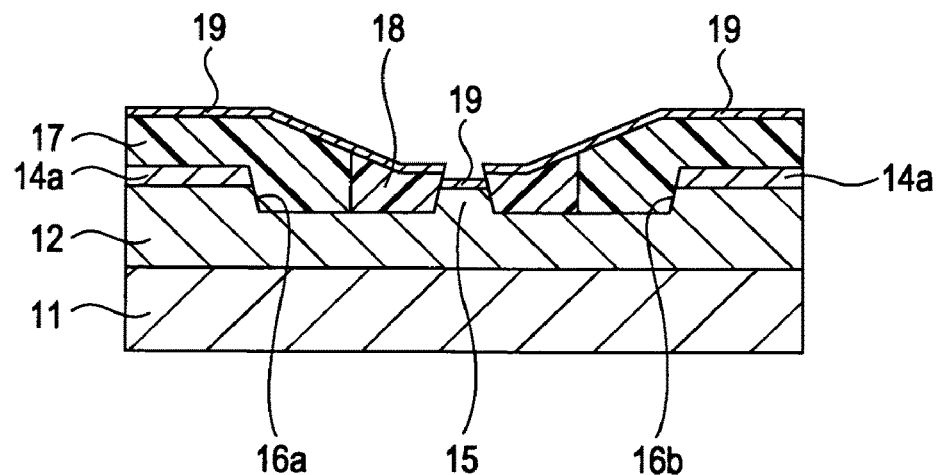

Next, as shown in FIG. 10A, a p-side electrode-forming metal film 19 is deposited over the entire surface including the resists 17 and 18 and the exposed upper surface of the ridge stripe 15. As the metal film 19, an ohmic metal film capable of ohmic contact with the p-type GaN contact layer is used. Specifically, for example, a Pd/Pt film is used as the metal film 19, and the thickness of each of the Pd film and the Pt film is, for example, about 15 nm. The metal film 19 may be formed by, for example, vacuum evaporation, sputtering, or the like, but the method is not limited to this. FIG. 10B is a sectional view taken along line XB-XB in FIG. 10A.

Figure 11A:
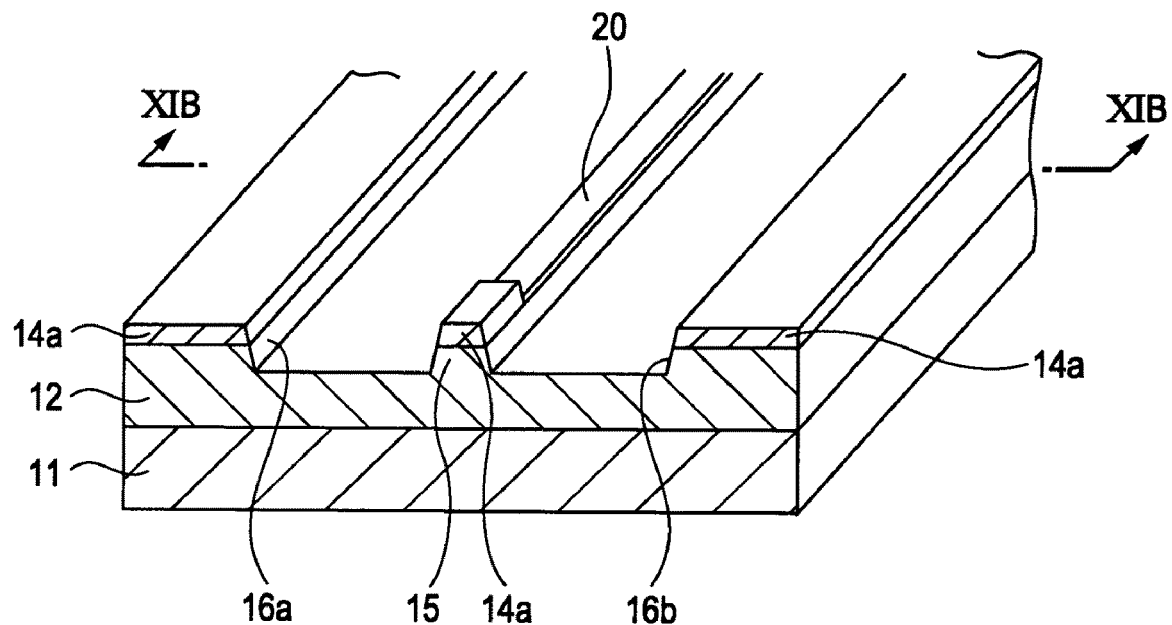
FIGS. 11A and 11B are a perspective view and a sectional view, respectively, illustrating the method for manufacturing a GaN-based semiconductor laser according to the first embodiment of the present invention.
Figure 11B:
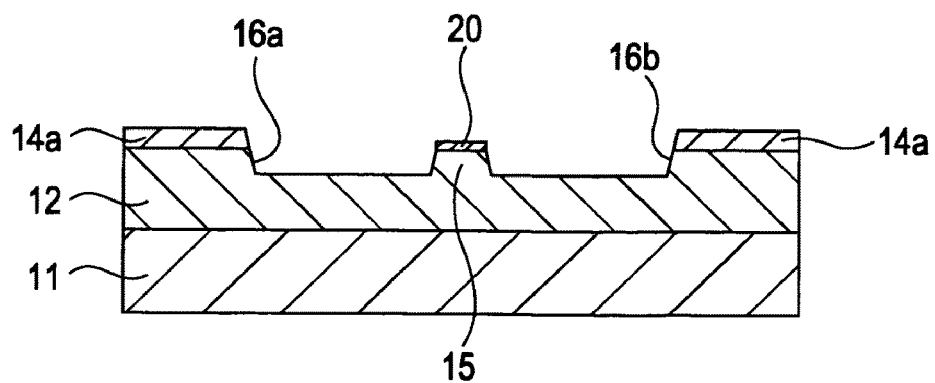

Next, as shown in FIG. 11A, the resists 17 and 18 are moved (lift off) together with the metal film 19 formed thereon. As a result, the metal film 19 is left only on the upper surface of the current injection region of the ridge stripe 15 to form a p-side electrode 20. FIG. 11B is a sectional view taken along line XIB-XIB in FIG. 11A.

Figure 12A:
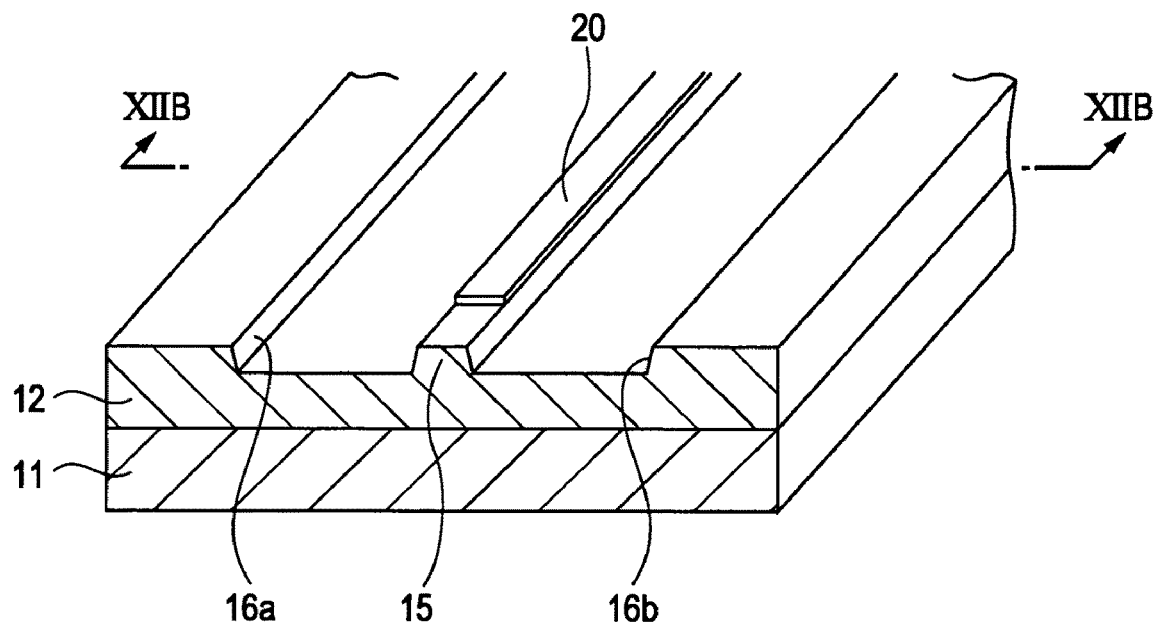
FIGS. 12A and 12B are a perspective view and a sectional view, respectively, illustrating the method for manufacturing a GaN-based semiconductor laser according to the first embodiment of the present invention.
Figure 12B:
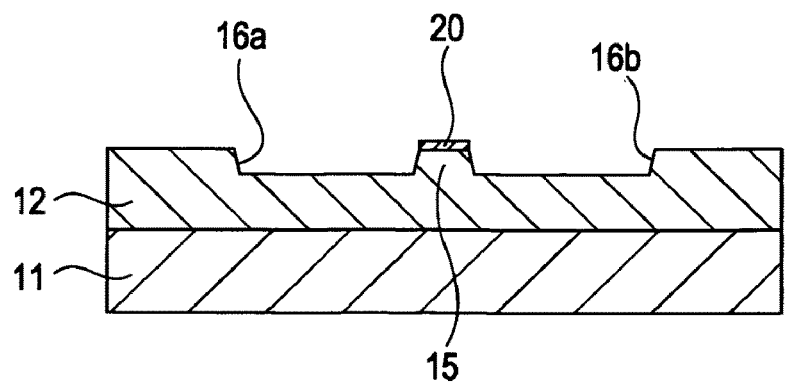

Next, as shown in FIG. 12A, the insulating film 13 left on the GaN-based semiconductor layer 12 is removed. For example, when the insulating film 13 includes a $SiO_2$ film, wet etching with a HF-type etchant is performed, but etching is not limited to this. FIG. 12B is a sectional view taken along line XIIB-XIIB in FIG. 12A.

Figure 13A:
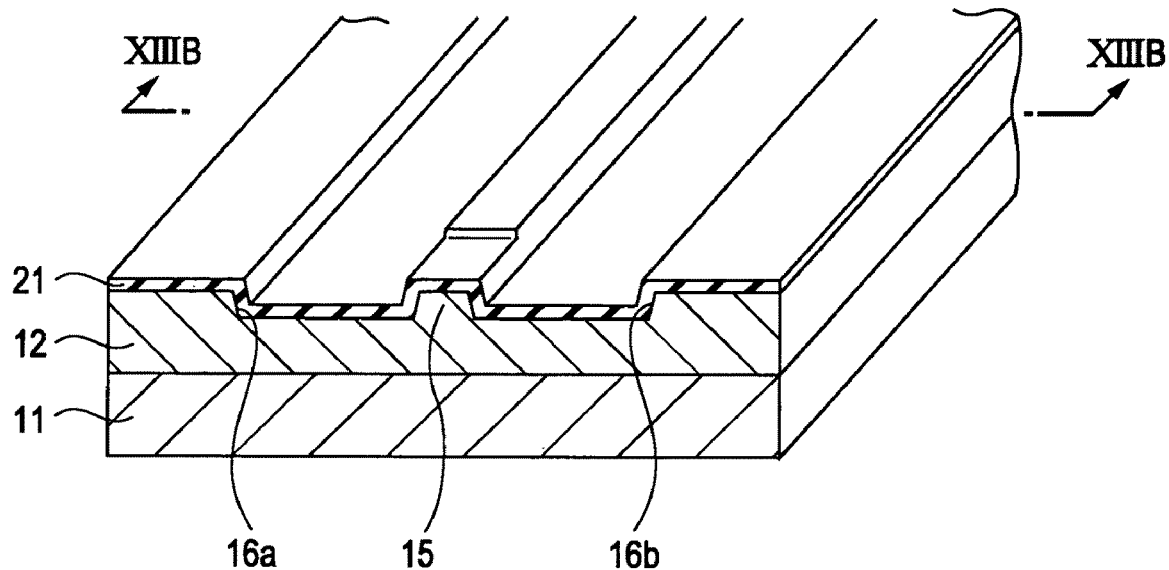
FIGS. 13A and 13B are a perspective view and a sectional view, respectively, illustrating the method for manufacturing a GaN-based semiconductor laser according to the first embodiment of the present invention.
Figure 13B:
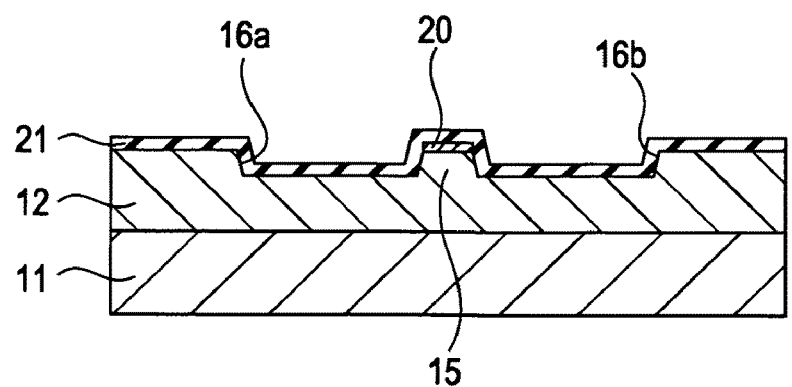

Next, as shown in FIG. 13A, a current-confining insulating film 21 is deposited over the entire surface of the GaN-based semiconductor layer 12. As the insulating film 21, for example, a $SiO_2$/Si film is used, and the thickness of the $SiO_2$ film is, for example, about 65 nm, and the thickness of the Si film is, for example, about 135 nm. The insulating film 21 may be formed by, for example, vacuum evaporation, CVD, or the like, but the method is not limited to this. FIG. 13B is a sectional view taken along line XIIIB-XIIIB in FIG. 13A.

Figure 14A:
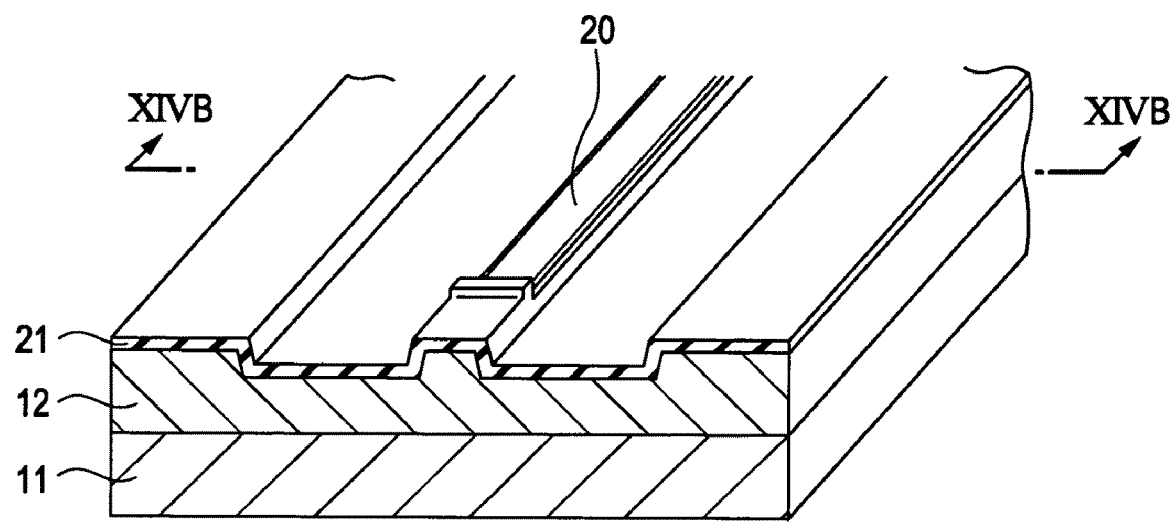
FIGS. 14A and 14B are a perspective view and a sectional view, respectively, illustrating the, method for manufacturing a GaN-based semiconductor laser according to the first embodiment of the present invention.
Figure 14B:
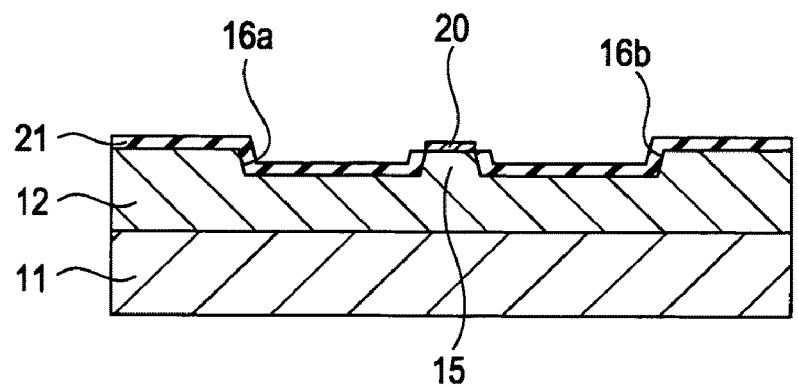

Next, as shown in FIG. 14A, the insulating film 21 is removed by etching from a portion of the ridge stripe 15 within the current injection region. The etching may be performed by the same method as that for removing by etching the mask 14 from the top of the ridge stripe 15 using the resists 17 and 18 to expose the upper surface of the ridge stripe 15 within the current injection region. FIG. 14B is a sectional view taken along line XIVB-XIVB in FIG. 14A.

Next, the entire surface of the GaN-based semiconductor layer 12 is coated with a resist (not shown), and the resist is exposed to light using a photomask having a mask patter with a predetermined shape formed therein corresponding to a pad electrode to be formed and is then developed. Next, a pad electrode-forming metal film is deposited over the entire surface. As the metal film, a metal film including at least a Ti film as a bottom layer is used. Specifically, for example, a Ti/Pt/Au film is used as the metal film, and the thickness of the Ti film in the bottom layer is 10 nm, the Pt film is 100 nm, and the thickness of the Au film in the top layer is 300 nm, but the thicknesses are not limited to these.

Figure 15A:
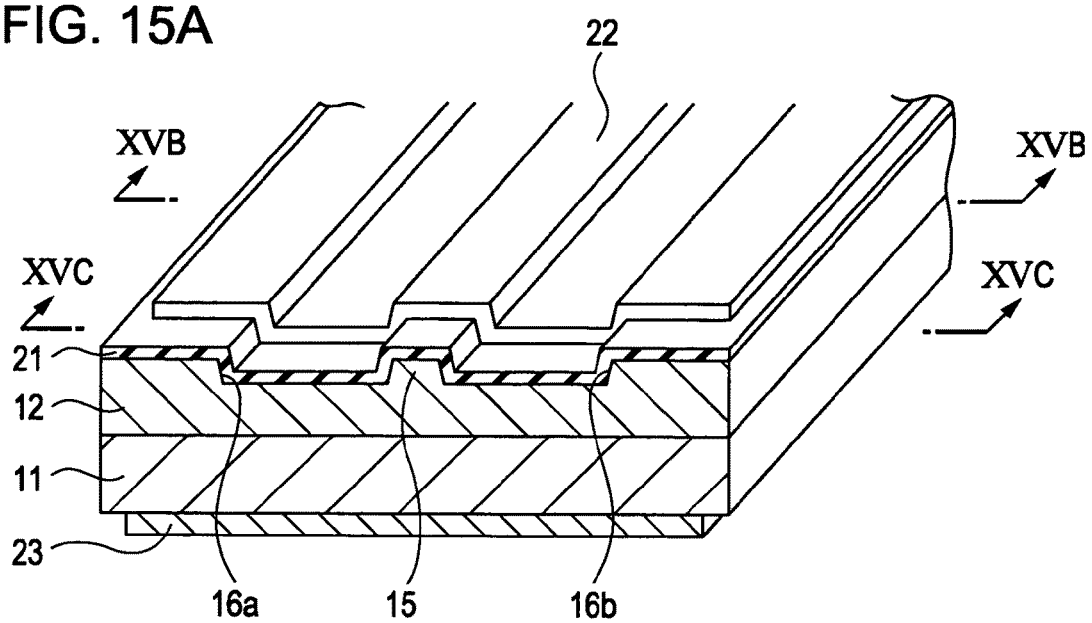
FIGS. 15A, 15B, and 15C are a perspective view, a sectional view, and a sectional view, respectively, illustrating the method for manufacturing a GaN-based semiconductor laser according to the first embodiment of the present invention.
Figure 15B:
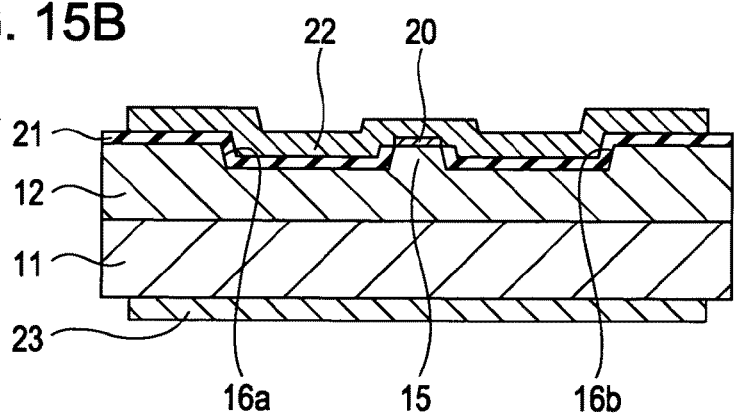
Figure 15C:
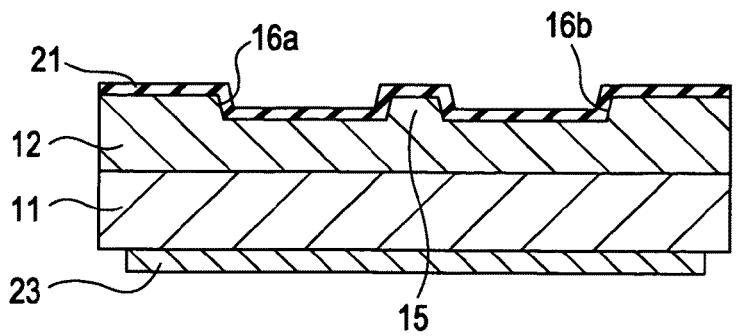
Figure 16:
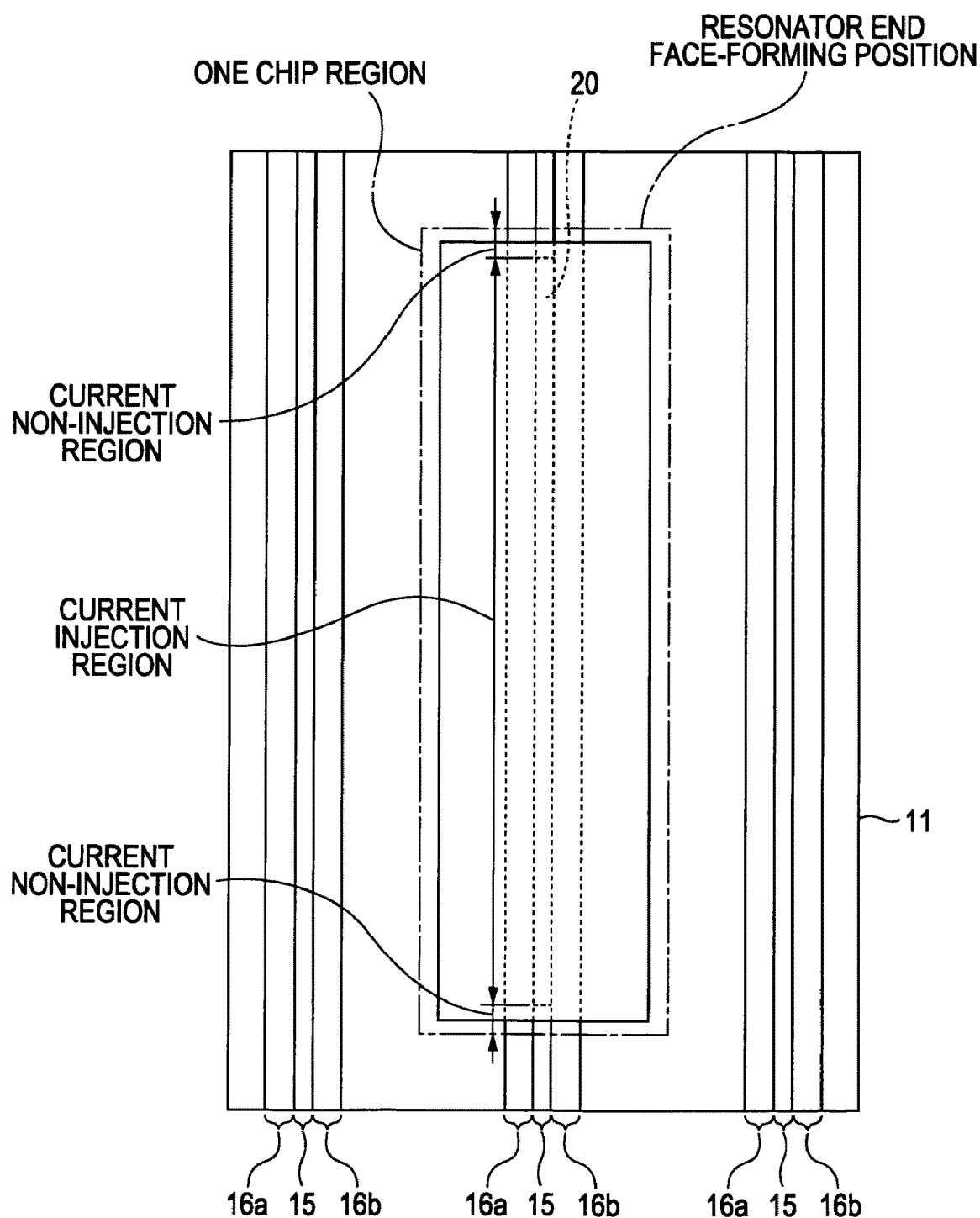
FIG. 16 is a plan view illustrating the method for manufacturing a GaN-based semiconductor laser according to the first embodiment of the present invention.
Figure 17:
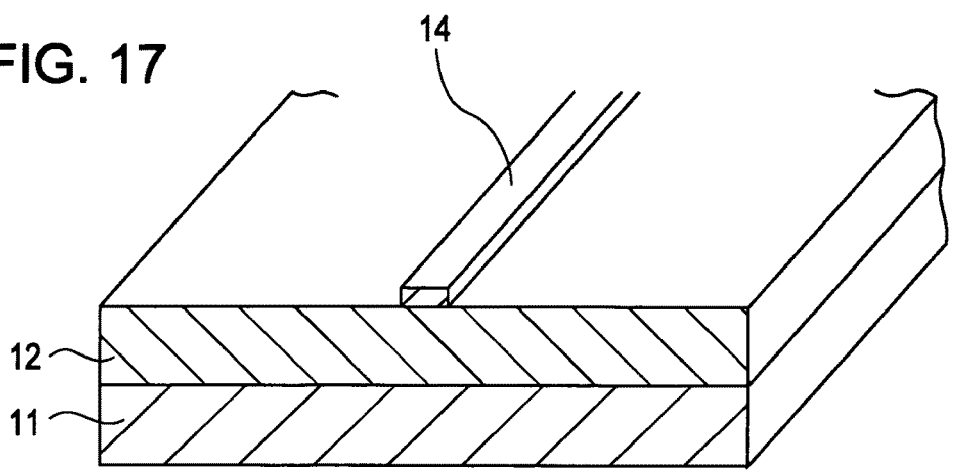
FIG. 17 is a perspective view illustrating a method for manufacturing a GaN-based semiconductor laser according to a second embodiment of the present invention.

Next, the resist is removed (lift off) together with the metal film formed thereon. As a result, as shown in FIG. 15A, a pad electrode 22 is formed to extend on the p-side electrode 20 and the current-confining insulating film 21. The pad electrode 22 is integrated with the p-side electrode 20 to form a p-side electrode as a whole. FIG. 15B is a sectional view taken along line XVB-XVB in FIG. 15A, and FIG. 15C is a sectional view taken along line XVC-XVC in FIG. 15A. FIG. 16 is a plan view showing this state within a wider region of the n-type GaN substrate 11.

Next, an n-side electrode 23 is formed by, for example, a lift-off method on the back side of the n-type GaN substrate 11 within each chip region.

Next, the n-type GaN substrate 11 on which a laser structure is formed as described above is cleaved to form a laser bar, thereby forming both resonator end faces. Next, the resonator end faces are coated, and then the laser bar is cleaved to form a chip.

As a result, a GaN-based semiconductor laser having a current non-injection structure near the end faces is manufactured.

As described above, according to the first embodiment, the p-side electrode 20 is easily formed with high positional precision only on the upper surface of the ridge stripe 15 within the current injection region excluding regions of the ridge stripe 15 near both resonator end faces. Therefore, a GaN-based semiconductor laser having a current non-injection structure near the end faces is easily manufactured. When a GaN-based semiconductor laser has a current non-injection structure near the end faces, COD of the resonator end faces may be effectively prevented with higher output, thereby increasing the life and improving reliability of the GaN-based semiconductor laser.

In addition, in the GaN-based semiconductor laser, the surface of the p-type GaN contact layer in the top layer of the ridge stripe 15 within the current injection region is exposed without damage to the p-type GaN contact layer. Since the upper surface of the ridge stripe 15 within the current injection region does not come in contact with an organic material during the manufacturing process, contamination with an organic material may be prevented. Therefore, the surface state of the p-type GaN contact layer at the top of the ridge stripe 15 may be stably maintained, thereby permitting good ohmic contact of the p-side electrode 20 with the p-type GaN contact layer with low contact resistance. Further, the Pd film of the p-side electrode 20 is in contact with the p-type GaN contact layer at the top of the ridge stripe 15, thereby permitting good ohmic contact of the p-side electrode 20 with the p-type GaN contact layer with low contact resistance. Consequently, the operating voltage of the GaN-based semiconductor laser may be decreased.

Further, the bottom layer of the pad electrode 22 formed on the current-confining insulating film 21 includes a Ti film, thereby improving the adhesion of the pad electrode 22 to the insulating film 21 and preventing separation of the pad electrode 22 from the insulating film 21. Therefore, it may be possible to increase the life and improve reliability of the GaN-based semiconductor laser.

Second Embodiment

Method for Manufacturing Semiconductor Laser

A method for manufacturing a GaN-based semiconductor laser according to a second embodiment is described. Although, like the GaN-based semiconductor laser according to the first embodiment, the GaN-based semiconductor laser according to the second embodiment has a ridge stripe structure and a current non-injection structure near the end faces, the second embodiment is different in that grooves are not formed on both sides of a ridge stripe.

In the second embodiment, first, a GaN-based semiconductor layer 12 is epitaxially grown on an n-type GaN substrate 11 by the same method as in the first embodiment, and then an insulating film 13 is formed over the entire surface of the GaN-based semiconductor layer 12. Then, heat treatment is performed for electrically activating p-type impurities doped in a p-type layer constituting the GaN-based semiconductor layer 12.

Next, the insulating film 13 is coated with a resist (not shown), and then the resist is exposed to light using a photomask having a mask pattern with a predetermined shape formed therein. Next, the selectively exposed resist is developed to form a mask portion having a stripe shape corresponding to the shape of a ridge stripe to be formed later. Actually a large number of the stripe portions is periodically formed in parallel with a predetermined pitch, but only the mask portion within the width of one laser chip is shown.

Next, the insulating film 13 is etched using as a mask the resist formed as described above to form a stripe-shaped mask layer 14. The width $w_1$ of the mask layer 14 is determined according to the width of a ridge stripe to be formed, but is, for example, 1.3 Rm. Then, the resist used in etching is removed.

Figure 18:
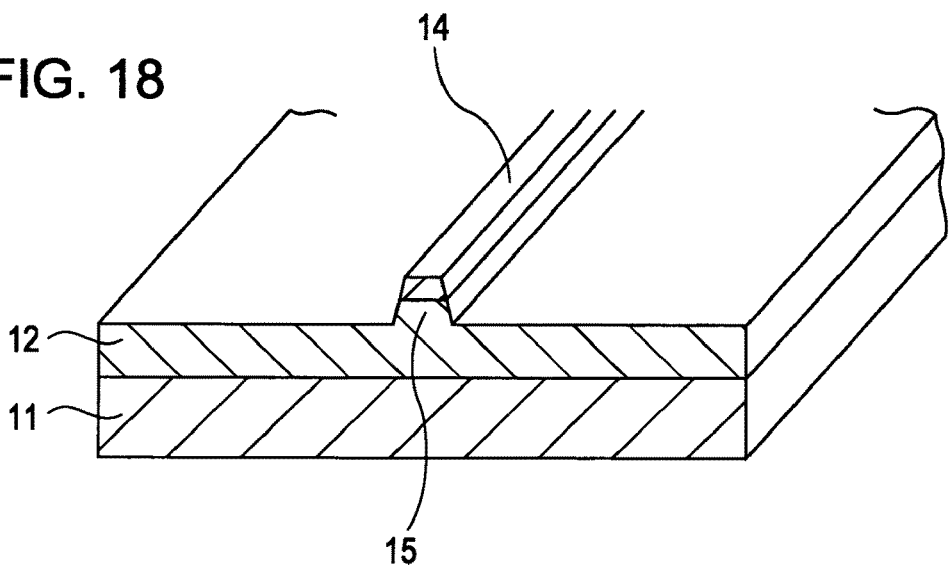
FIG. 18 is a perspective view illustrating the method for manufacturing a GaN-based semiconductor laser according to the second embodiment of the present invention.

Next, as shown in FIG. 18, the GaN-based semiconductor layer 12 is dry-etched to a predetermined depth by a RIE method using the mask layer 14 to form a ridge stripe 15.

Figure 19:
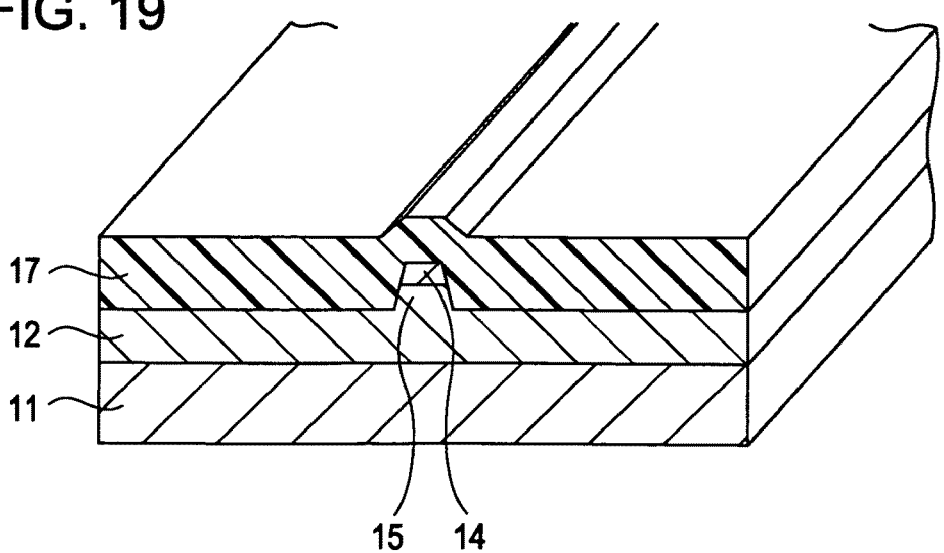
FIG. 19 is a perspective view illustrating the method for manufacturing a GaN-based semiconductor laser according to the second embodiment of the present invention.

Next, as shown in FIG. 19, the entire surface of the GaN-based semiconductor layer 12 having the ridge stripe 15 formed therein as described above is coated with a resist 17.

Figure 20A:
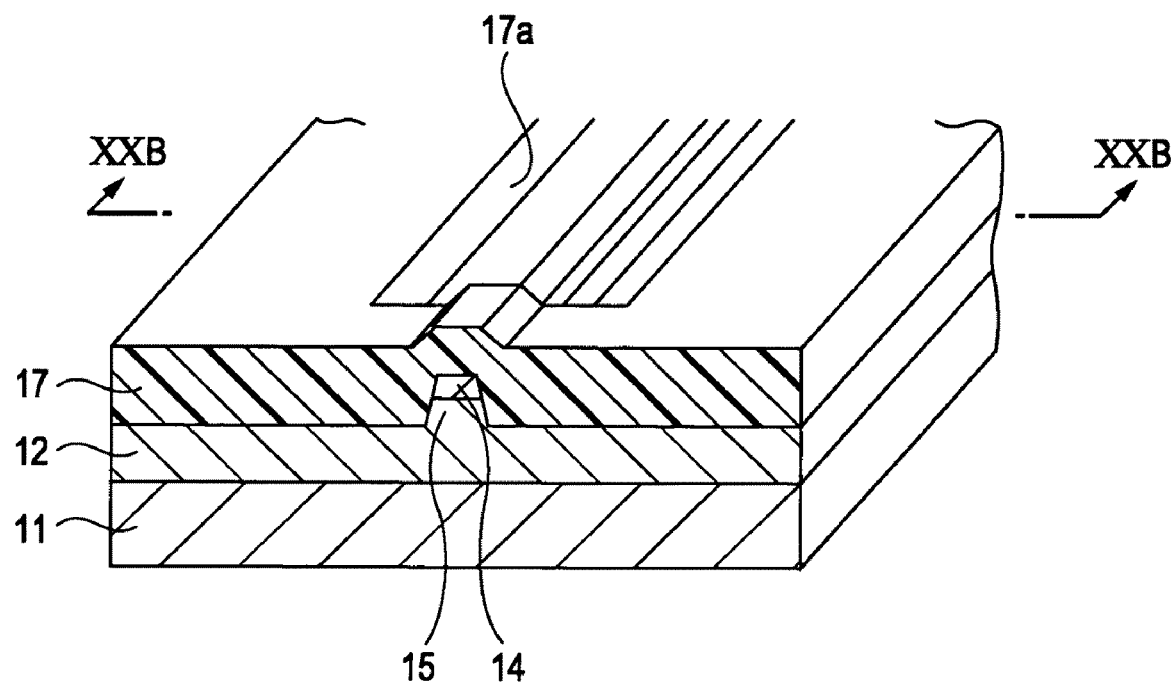
FIGS. 20A and 20B are a perspective view and a sectional view, respectively, illustrating the method for manufacturing a GaN-based semiconductor laser according to the second embodiment of the present invention.
Figure 20B:
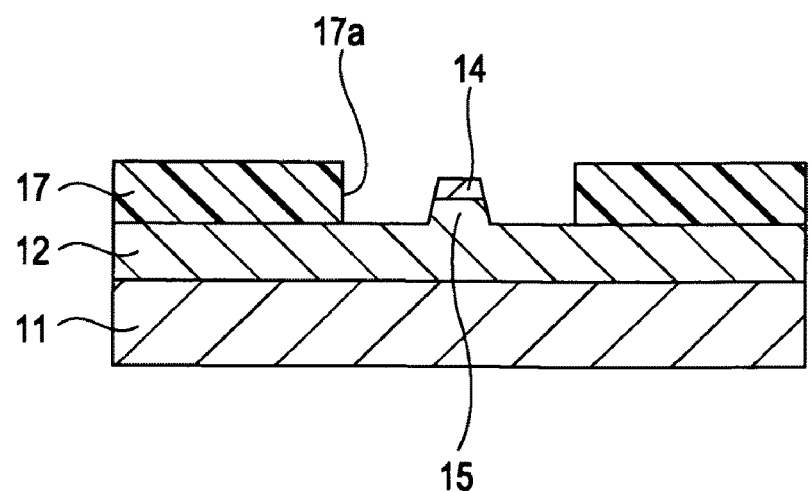

Next, as shown in FIG. 20A, the resist 17 is exposed to light using a photomask having a mask pattern with a predetermined shape formed therein and is further developed. As a result, the resist 17 having an opening 17a with a rectangular planar shape is formed, the opening 17a including a portion of the ridge stripe 15, which corresponds to a current injection region. FIG. 20B is a sectional view taken along line XXB-XXB in FIG. 20A. Then, the surface of the resist 17 is irradiated with ultraviolet light to form a modified layer (not shown) and is cured.

Figure 21A:
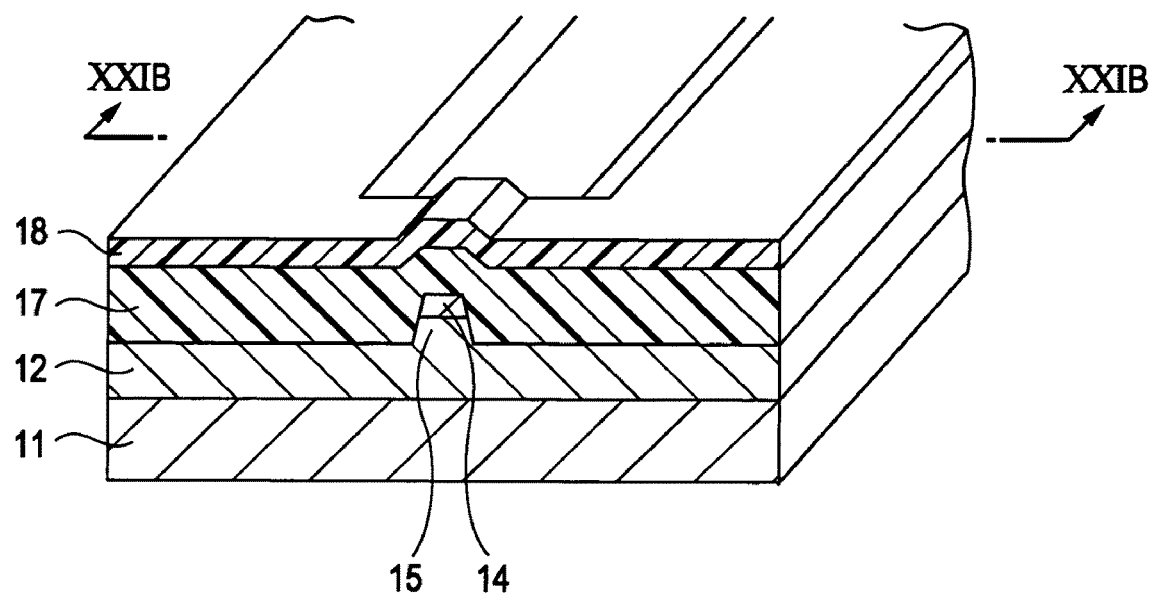
FIGS. 21A and 21B are a perspective view and a sectional view, respectively, illustrating the method for manufacturing a GaN-based semiconductor laser according to the second embodiment of the present invention.
Figure 21B:
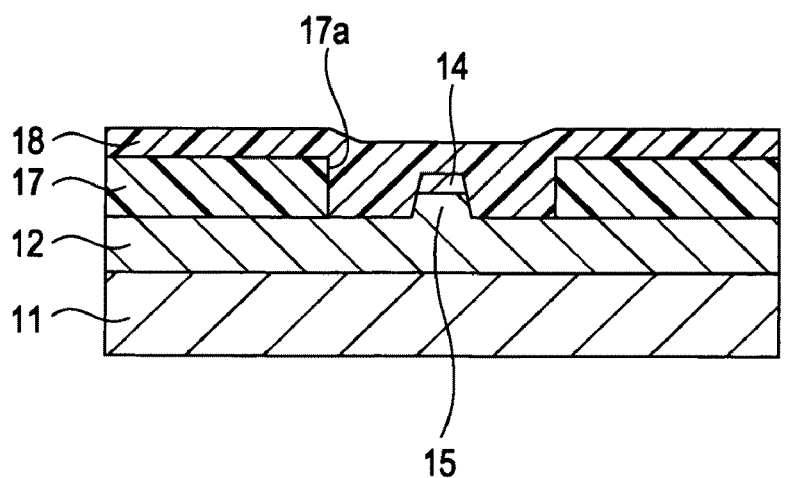

Next, as shown in FIG. 21A, the entire surface of the GaN-based semiconductor layer 12 having the resist 17 formed thereon as described above is coated with a resist 18, and then the resist 18 is solidified by baking. In this case, the thickness of the resist 18 on the ridge stripe 15 within the opening 17a is sufficiently smaller than the thickness of the resist 18 outside the ridge stripe 15 or the total thickness of the resists 17 and 18. FIG. 21B is a sectional view taken along line XXIB-XXIB in FIG. 21A.

Figure 22A:
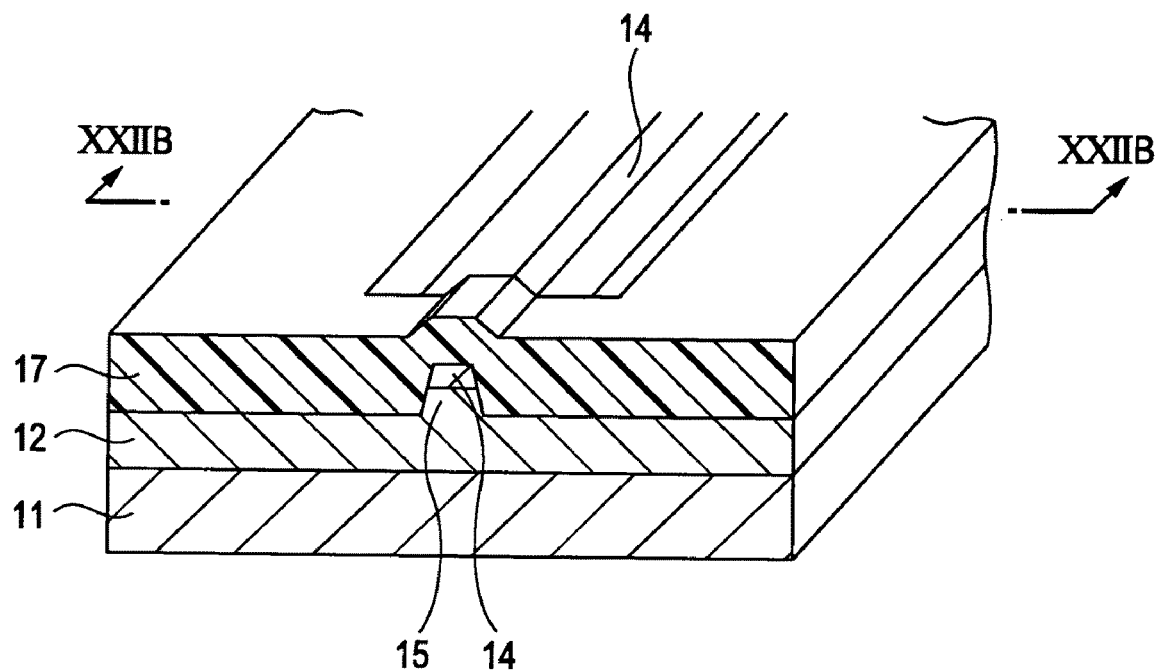
FIGS. 22A and 22B are a perspective view and a sectional view, respectively, illustrating the method for manufacturing a GaN-based semiconductor laser according to the second embodiment of the present invention.
Figure 22B:
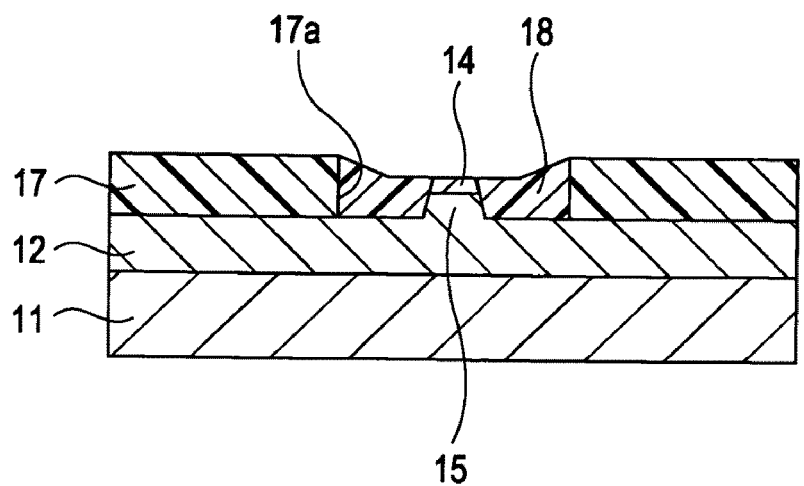

Next, as shown in FIG. 22A, the resists 17 and 18 are etched-back by a RIE method in a direction perpendicular to the surface of the n-type GaN substrate 11 to expose the mask portion 14a of the mask layer 14 on the ridge stripe 15. FIG. 22B is a sectional view taken along line XXIIB-XXIIB in FIG. 22A.

Figure 23A:
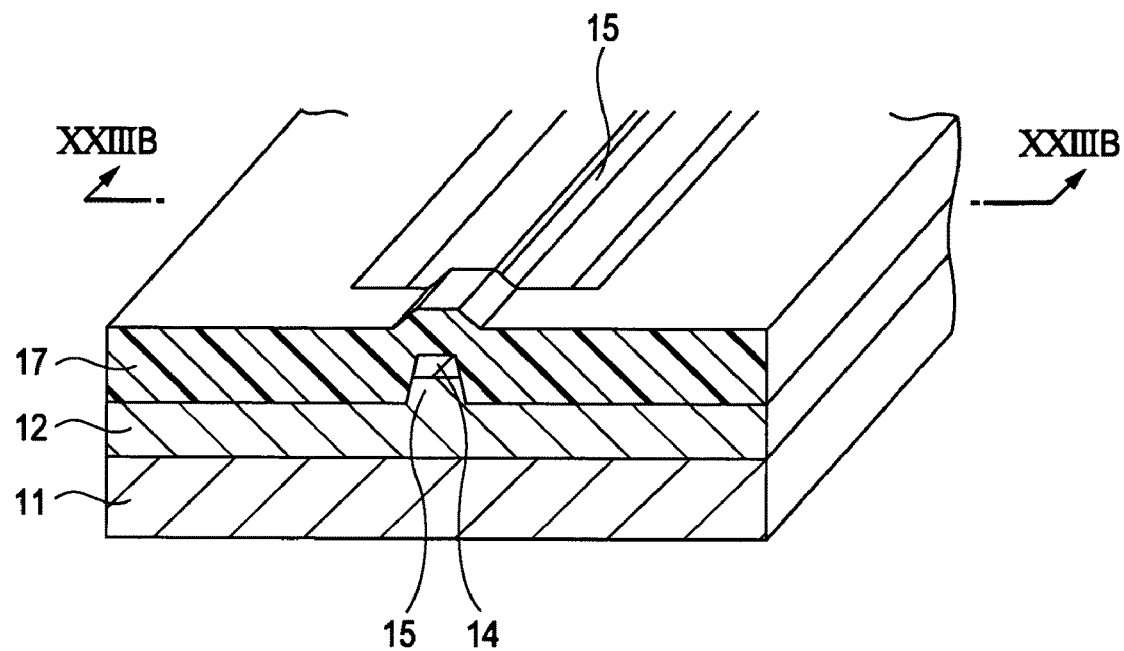
FIGS. 23A and 23B are a perspective view and a sectional view, respectively, illustrating the method for manufacturing a GaN-based semiconductor laser according to the second embodiment of the present invention.
Figure 23B:
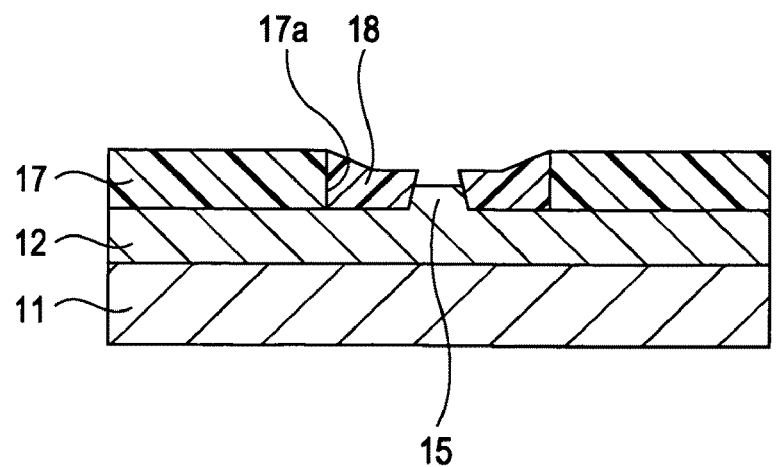

Next, as shown in FIG. 23A, the exposed mask layer 14 is removed by etching to expose the upper surface of the ridge stripe 15 within the current injection region. For example, when the mask layer 14 includes a SiO$_2$ film, wet etching with a HF-type etchant is performed, but etching is not limited to this. FIG. 23B is a sectional view taken along line XIIIB-XIIIB in FIG. 23A.

Figure 24A:
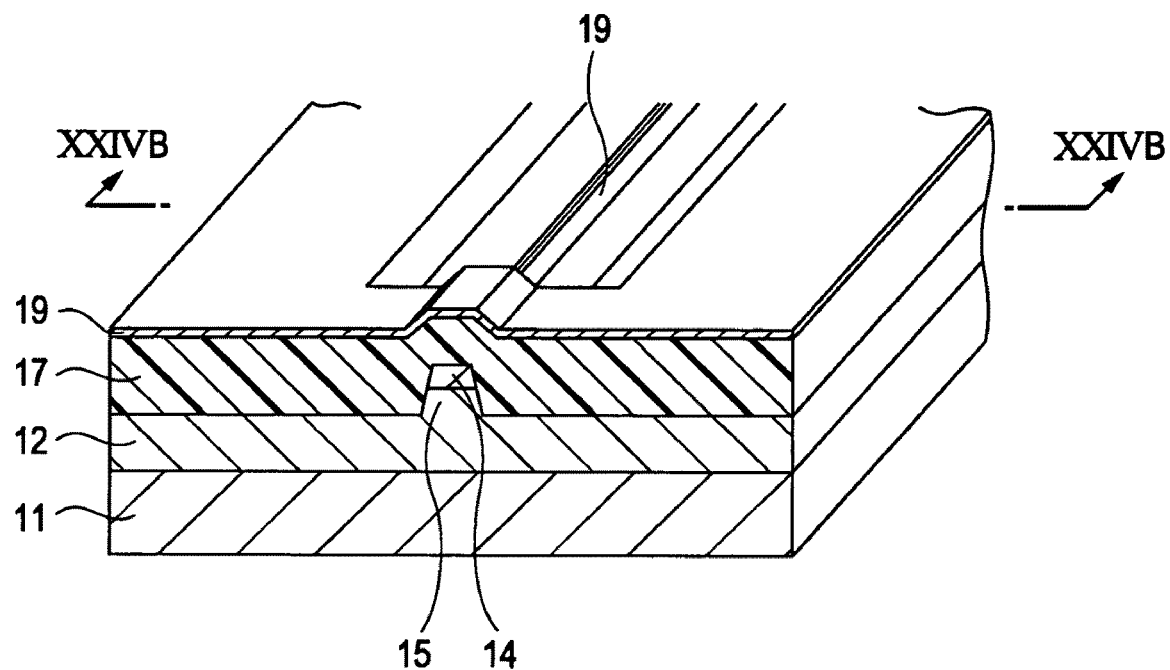
FIGS. 24A and 24B are a perspective view and a sectional view, respectively, illustrating the method for manufacturing a GaN-based semiconductor laser according to the second embodiment of the present invention.
Figure 24B:
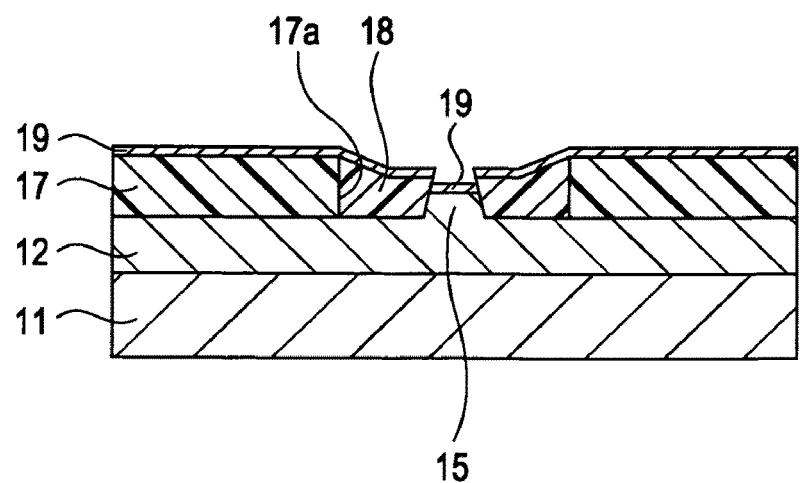

Next, as shown in FIG. 24A, a p-side electrode-forming metal film 19 is deposited over the entire surface including the resists 17 and 18 and the exposed upper surface of the ridge stripe 15. FIG. 24B is a sectional view taken along line XXIVB-XXIVB in FIG. 24A.

Figure 25A:
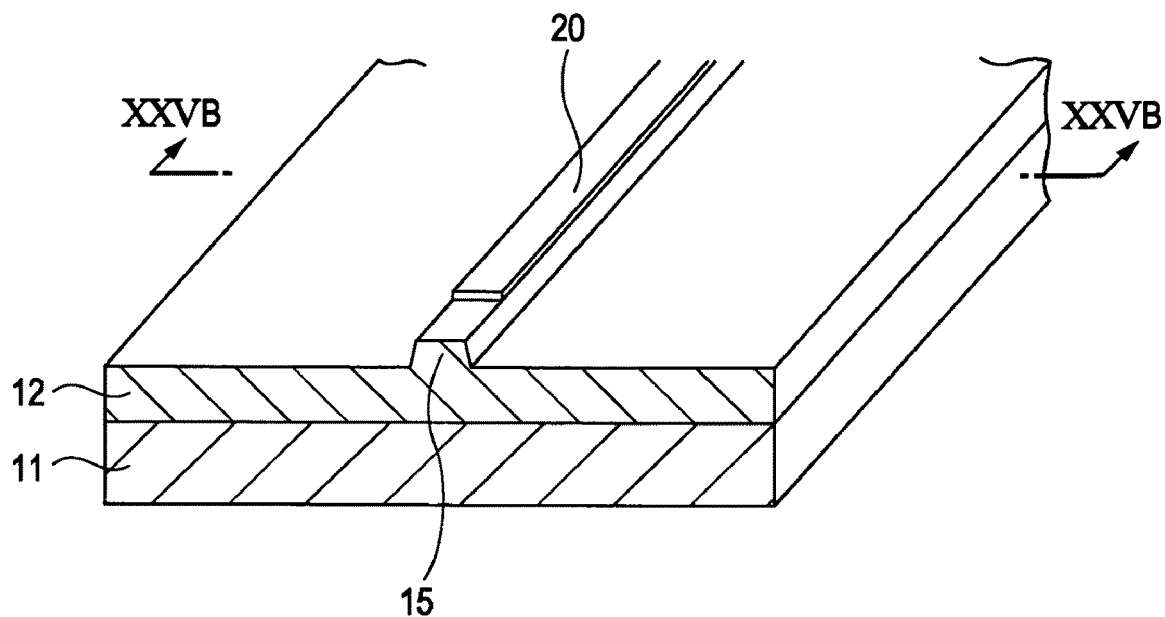
FIGS. 25A and 25B are a perspective view and a sectional view, respectively, illustrating the method for manufacturing a GaN-based semiconductor laser according to the second embodiment of the present invention.
Figure 25B:
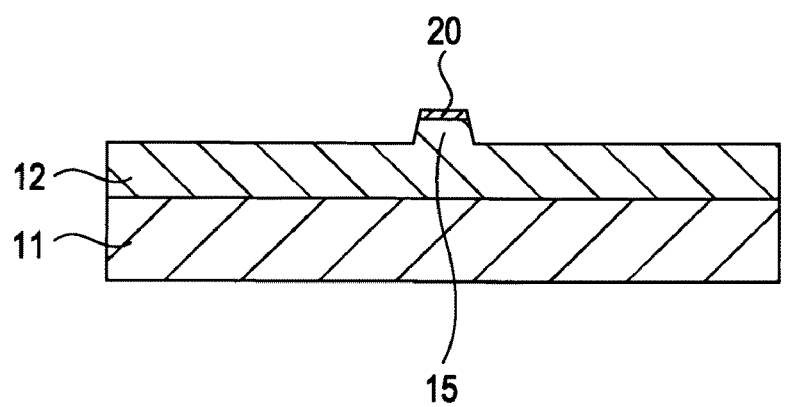

Next, as shown in FIG. 25A, the resists 17 and 18 are moved (lift off) together with the metal film 19 formed thereon. As a result, the metal film 19 is left only on the upper surface of the current injection region of the ridge stripe 15 to form a p-side electrode 20. FIG. 25B is a sectional view taken along line XXVB-XXVB in FIG. 25A.

Then, the same steps as in the first embodiment are performed to manufacture an intended GaN-based semiconductor laser having a current non-injection structure near an end face.

According to the second embodiment, the same various advantages as those of the first embodiment are obtained.

Third Embodiment

Method for Manufacturing Semiconductor Laser

A method for manufacturing a GaN-based semiconductor laser according to a third embodiment is described. Like the GaN-based semiconductor laser according to the first embodiment, the GaN-based semiconductor laser according to the third embodiment has a ridge stripe structure and a current non-injection structure near the end face.

In order to increase the output of a GaN-based semiconductor laser, it is desirable to simultaneously improve the kink level and suppress heat generation. In order to improve the kink level, it is desirable to decrease the width (ridge width) of a ridge stripe, and thus it is desirable to make both side surfaces of the ridge stripe more vertical. This is because when the ridge stripe is narrowed, the area of the upper surface of the ridge stripe is decreased to decrease the contact area with a p-side electrode, thereby causing the problem of increasing the contact resistance of the p-side electrode.

Therefore, in the third embodiment, a method for improving perpendicularity of both side surfaces of the ridge stripe 15 in the GaN-based semiconductor laser according to the first or second embodiments is described.

Figure 26:
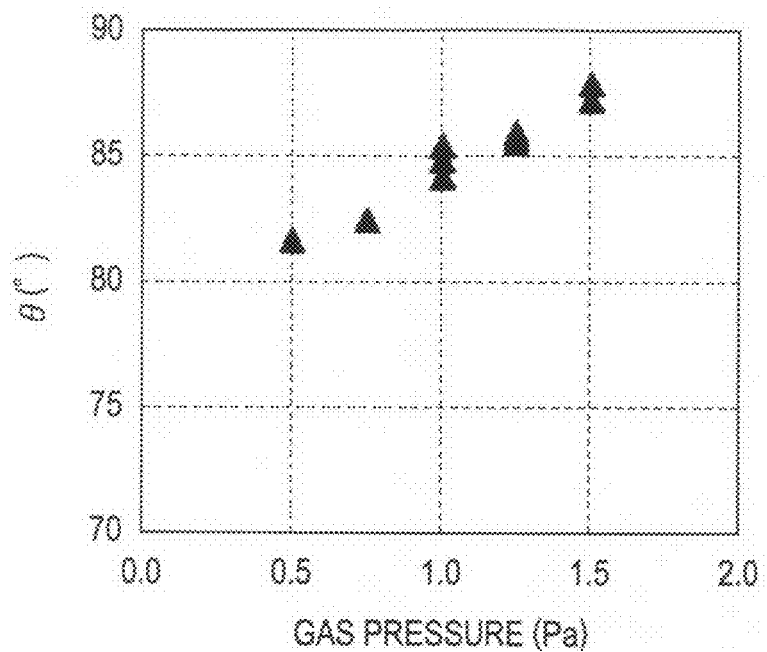
FIG. 26 is a schematic diagram showing changes in an inclination angle of both side surfaces of a ridge stripe with etching gas pressure when the ridge stripe is formed by a RIE method in a method for manufacturing a GaN-based semiconductor laser according to a third embodiment of the present invention.

Namely, in the first or second embodiment, when the GaN-based semiconductor layer 12 is dry-etched to a predetermined depth by a RIE method using the mask layer 14 to form the ridge stripe 15, the conditions of the RIE method are determined as follows. A chlorine-based gas is used as etching gas, the gas pressure is 0.5 to 1.5 Pa, and the gas flow rate is 5 to 100 sccm, for example, 90 sccm. FIG. 26 shows the results of measurement of the inclination angle θ of both side surfaces of each of the ridge stripes 15 formed under various gas pressures by the RIE method with respect to the surface of the n-type GaN substrate 11. However, the gas flow rate was 90 sccm.

Figure 27:
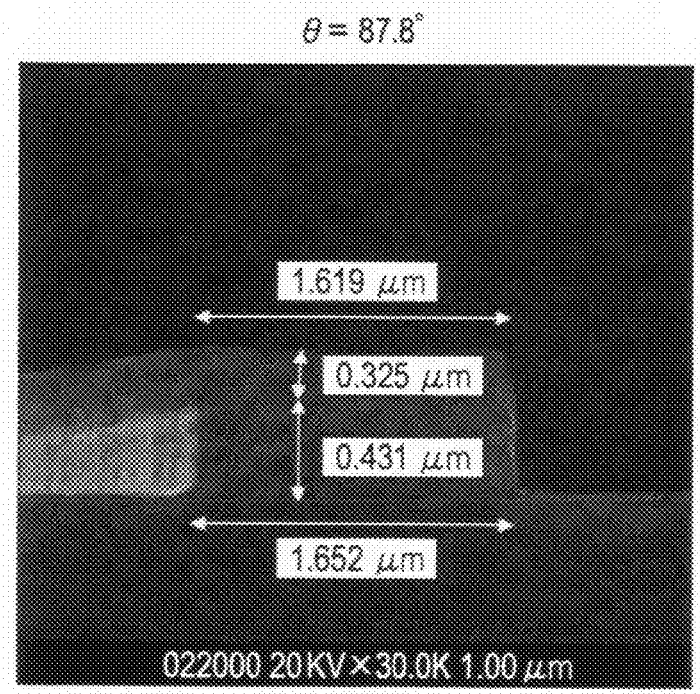
FIG. 27 is a photograph substitutive to a drawing showing a sectional SEM image of a sample of a ridge stripe formed under optimum etching gas pressure by a RIE method in a method for manufacturing a GaN-based semiconductor laser according to a third embodiment of the present invention.
Figure 28:
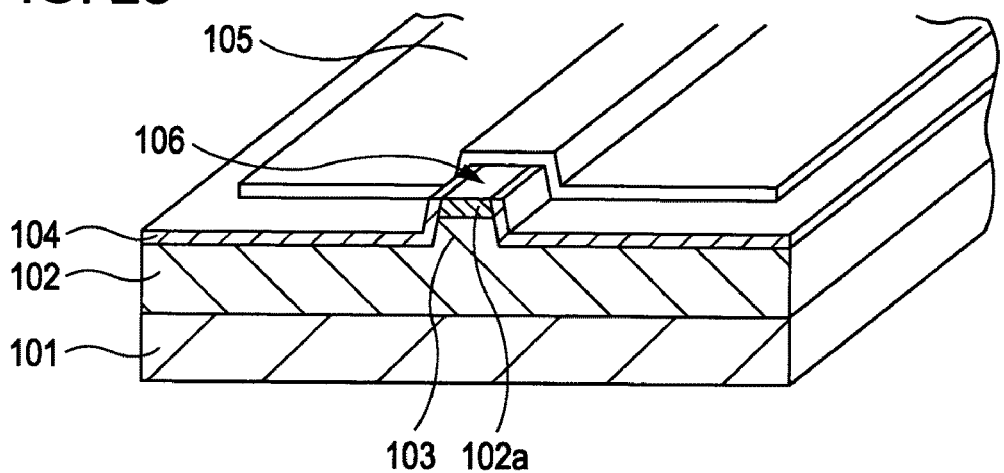
FIG. 28 is a schematic drawing showing a first example of a related-art nitride-based semiconductor laser including a current non-injection structure near an end face.
Figure 29:
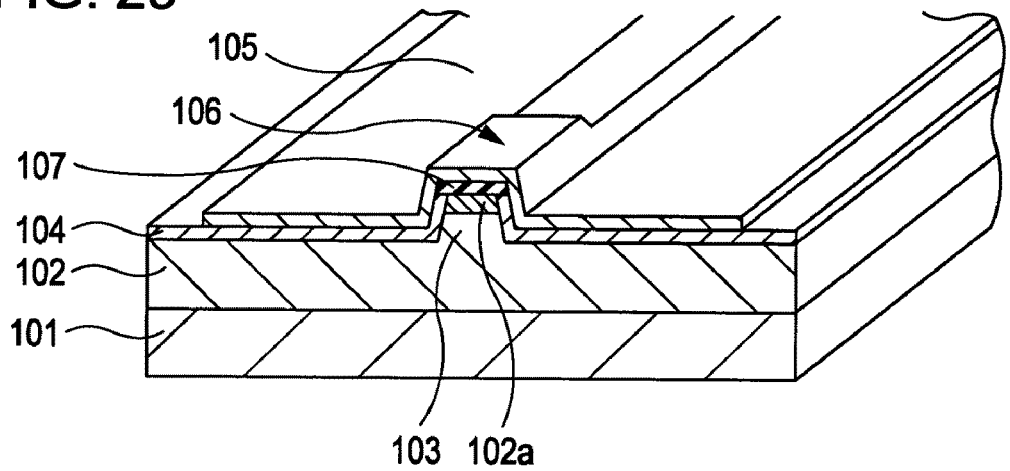
FIG. 29 is a schematic drawing showing a second example of a related-art nitride-based semiconductor laser including a current non-injection structure near an end face.
Figure 30:
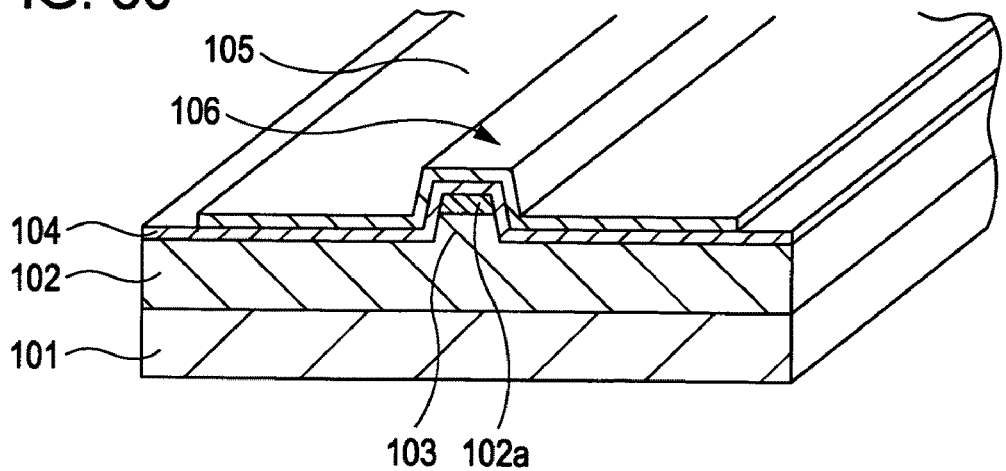
FIG. 30 is a schematic drawing showing a third example of a related-art nitride-based semiconductor laser including a current non-injection structure near an end face.

FIG. 26 indicates that within the gas pressure range of 0.5 to 1.5 Pa, the inclination angle θ is about 82 to 87.8°, and high perpendicularity is obtained. In particular, when the gas pressure is 1.5 Pa, the inclination angle θ is about 87.8°, and very high perpendicularity is exhibited. FIG. 27 shows a sectional SEM image of a sample of the ridge stripe 15 formed by the RIE method under a gas pressure of 1.5 Pa.

In the third embodiment, the other characteristics are the same as in the first or second embodiment.

According to the third embodiment, in addition to the same advantages as the first or second embodiment, the advantage described below may be obtained. Since perpendicularity of both side surfaces of the ridge stripe 15 is improved, it may be possible to simultaneously improve the kink level and suppress heat generation of the GaN-based semiconductor laser.

Although the embodiments of the present invention are described in detail above, the present invention is not limited to the embodiments, and various modifications may be made on the basis of the technical idea of the present invention.

For example, the values, structures, substrates, raw materials, processes, and the like described in the embodiments are only examples, and different values, structures, substrates, raw materials, processes, and the like may be used according to demand.

Specifically, for example, in the first to third embodiments, application of the present invention to manufacture of a GaN-based semiconductor laser having a SCH structure is described. However, the present invention may be applied to, for example, manufacture of a GaN-based semiconductor laser having a DH (Double heterostructure) structure.

The present application contains subject matter related to that disclosed in Japanese Priority Patent Application JP 2008-318052 filed in the Japan Patent Office on Dec. 15, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a semiconductor laser comprising the steps of:
   forming a mask layer having a stripe-shaped mask portion corresponding to a ridge stripe to be formed on a nitride-based group III-V compound semiconductor layer in which a laser structure is formed;
   etching the nitride-based group III-V compound semiconductor layer to a predetermined depth using the mask layer to form the ridge stripe;
   forming a resist to cover the mask layer and the nitride-based group III-V compound semiconductor layer so that the thickness of the resist is minimized on a portion of the stripe-shaped mask portion of the mask layer, which corresponds to a current injection region of the ridge stripe;
   etching-back the resist until the stripe-shaped mask portion of the mask layer is exposed;
   removing the exposed stripe-shaped mask portion of the mask layer by etching to expose the upper surface of the ridge stripe;
   forming a metal film for forming an electrode on the resist and the exposed ridge stripe to form an electrode on the ridge stripe;

removing the resist together with the metal film formed thereon; and removing the mask layer by etching after removing the resist.

2. The method for manufacturing a semiconductor laser according to claim 1, wherein a portion of the ridge stripe, which is disposed between a resonator end face-forming position and the electrode, serves as a current non-injection region.

3. The method for manufacturing a semiconductor laser according to claim 2, wherein the resist is formed by forming a first resist to cover the mask layer and the nitride-based group III-V compound semiconductor layer, forming, in the first resist, an opening including the current injection region of the ridge stripe and having a width equal to the length of the current injection region in the extension direction of the ridge stripe, and then forming a second resist on the first resist and the opening.

4. The method for manufacturing a semiconductor laser according to claim 3, further comprising, after the mask layer is removed by etching, a step of forming a current-confining insulating film to extend on the electrode, the upper surface of a portion of the ridge stripe on which the electrode is not formed, both side surfaces of the ridge stripe, and the bottoms on both sides of the ridge stripe.

5. The method for manufacturing a semiconductor laser according to claim 4, further comprising a step of etching off a portion of the current-confining insulating film, which is disposed on the electrode, to expose the electrode after forming the current-confining insulating film.

6. The method for manufacturing a semiconductor laser according to claim 5, further comprising a step of forming a pad electrode extending on the electrode and the current-confining insulating film after exposing the electrode.

7. The method for manufacturing a semiconductor laser according to claim 6, wherein the top portion of the ridge stripe includes a p-type contact layer, and the electrode is a p-side electrode in contact with the p-type contact layer.

8. The method for manufacturing a semiconductor laser according to claim 7, wherein the bottom layer of the electrode is composed of Pd or Ni, and the bottom layer of the pad electrode is composed of Ti.

* * * * *